(12) United States Patent
Cheng et al.

(10) Patent No.: US 10,720,431 B1
(45) Date of Patent: Jul. 21, 2020

(54) METHODS OF FABRICATING SEMICONDUCTOR DEVICES HAVING GATE-ALL-AROUND STRUCTURE WITH OXYGEN BLOCKING LAYERS

(71) Applicant: Taiwan Semiconductor Manufacturing Co., Ltd., Hsinchu (TW)

(72) Inventors: Chung-Liang Cheng, Changhua County (TW); Ziwei Fang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/258,004

(22) Filed: Jan. 25, 2019

(51) Int. Cl.
| | |
|---|---|
| H01L 27/092 | (2006.01) |
| H01L 29/66 | (2006.01) |
| H01L 29/78 | (2006.01) |
| H01L 29/49 | (2006.01) |
| H01L 21/8238 | (2006.01) |
| H01L 21/28 | (2006.01) |
| H01L 21/308 | (2006.01) |
| H01L 21/02 | (2006.01) |

(52) U.S. Cl.
CPC ...... *H01L 27/0924* (2013.01); *H01L 21/0228* (2013.01); *H01L 21/28088* (2013.01); *H01L 21/3086* (2013.01); *H01L 21/823814* (2013.01); *H01L 21/823821* (2013.01); *H01L 21/823828* (2013.01); *H01L 21/823864* (2013.01); *H01L 21/823878* (2013.01); *H01L 29/4966* (2013.01); *H01L 29/66545* (2013.01); *H01L 29/66795* (2013.01); *H01L 29/785* (2013.01); *H01L 2029/7858* (2013.01)

(58) Field of Classification Search
CPC ......... H01L 27/0924; H01L 21/823828; H01L 21/823821; H01L 21/823878; H01L 21/823864
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |

(Continued)

*Primary Examiner* — Anthony Ho
(74) *Attorney, Agent, or Firm* — Birch, Stewart, Kolasch & Birch, LLP

(57) ABSTRACT

A method of fabricating semiconductor devices is provided. The method includes forming a fin structure including a stack of alternating first and second semiconductor layers on a substrate, removing the first semiconductor layers to form spaces between the second semiconductor layers, and depositing a gate dielectric layer to surround the second semiconductor layers. The method also includes depositing a first oxygen blocking layer and removing the native oxide thereof, depositing an n-type work function layer, and forming a second oxygen blocking layer in sequence on the gate dielectric layer to surround the second semiconductor layers in the same process chamber. The second oxygen blocking layer includes a capping layer and a capping film. The method further includes forming a metal gate fill material over the capping film to form a gate-all-around structure.

20 Claims, 17 Drawing Sheets

(56) References Cited

U.S. PATENT DOCUMENTS 9,536,738 B2    1/2017    Huang et al.
9,576,814 B2    2/2017    Wu et al.
9,608,116 B2    3/2017    Ching et al.

METHODS OF FABRICATING SEMICONDUCTOR DEVICES HAVING GATE-ALL-AROUND STRUCTURE WITH OXYGEN BLOCKING LAYERS

BACKGROUND

The semiconductor integrated circuit (IC) industry has experienced exponential growth. Technological advances in IC materials and designs have produced generations of ICs where each generation has smaller and more complex circuits than the previous generation. As the semiconductor IC industry has progressed into nanometer process nodes in pursuit of higher device density, higher performance, and lower costs, challenges from both fabrication and design issues have resulted in the development of three-dimensional designs, such as a Fin Field Effect Transistor (FinFET).

FinFET devices typically include semiconductor fins with high aspect ratios and in the fin channel and source/drain regions are formed. A gate structure is formed over and along the sides of the fin (e.g., wrapping) utilizing the advantage of the increased surface area of the channel to produce faster, more reliable, and better-controlled semiconductor transistor devices. However, since device feature sizes continue to decrease, fabrication processes continue to become more difficult to perform. There are still various challenges in the fabrication of FinFET devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
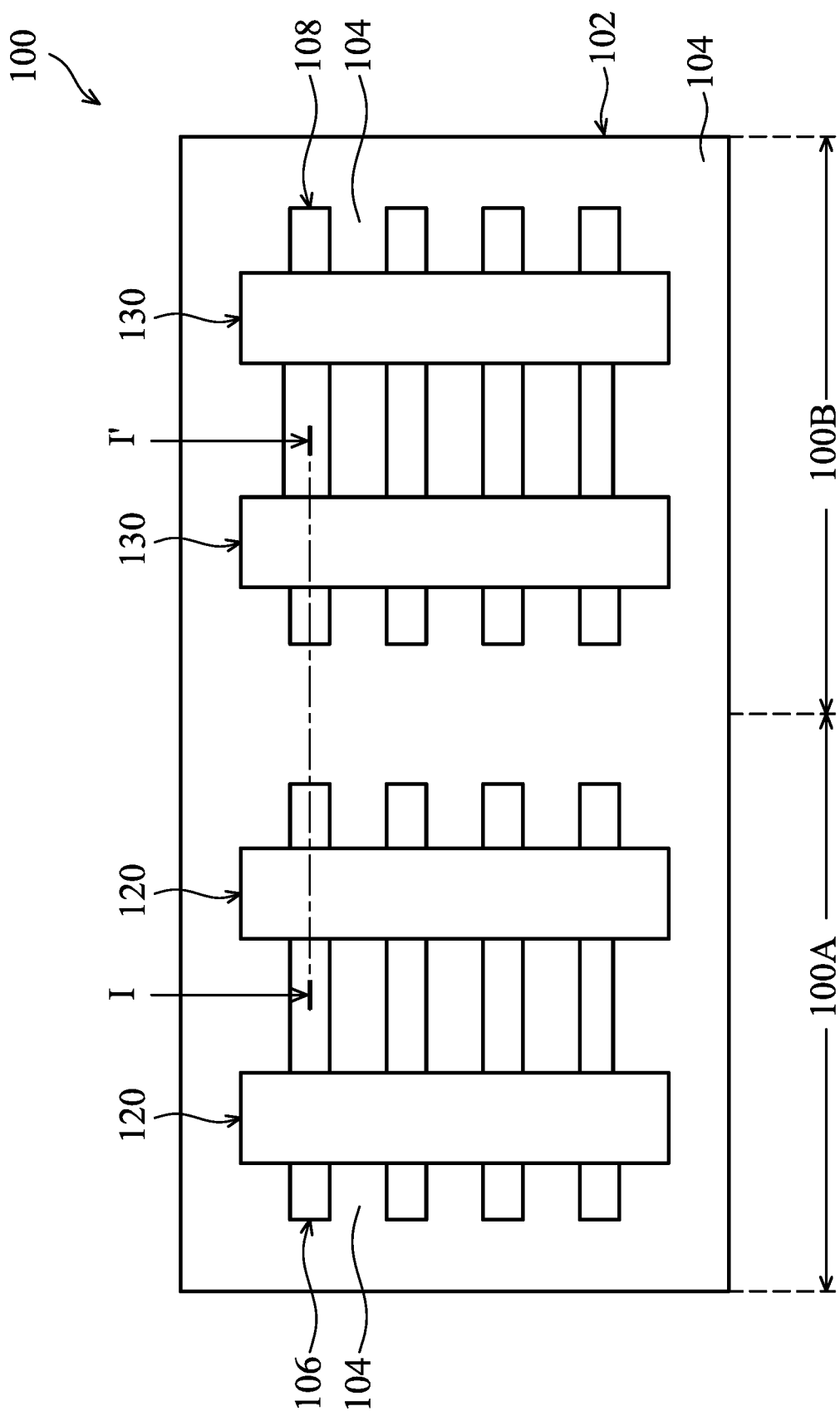
FIG. 1 shows a plane view of an intermediate structure at one stage of an exemplary method for fabricating a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

For advanced technology of semiconductor devices, the most common way to get ultra-low threshold voltage (Vt) of n-type metal-oxide-semiconductor Field Effect Transistor (nMOSFET) is to increase the thickness of n-type work function (nWF) layer. However, for Fin Field Effect Transistor (FinFET) devices with GAA structures at technology nodes of 3 nm (N3) and below, the space between nanosheets (also referred to as sheet-sheet spacing) is not large enough for a thick nWF layer of large than about 40 Å in the sheet-sheet spacing. An ultra-thin nWF layer is easy formed in the space between nano-sheets and may also be easy oxidized to cause the work function of n-type metal gate shift to p-type work function which induces higher Vt in the nMOSFET.

Embodiments disclosed herein relate generally to fabricating semiconductor devices having a GAA structure with oxygen blocking layers. The oxygen blocking layers in the GAA structure can protect an ultra-thin n-type work function (nWF) layer for ultra-low Vt tuning of nMOSFET. The semiconductor devices are for example FinFET devices having different GAA structures in n-type MOS (nMOS) and p-type MOS (pMOS) regions. The oxygen blocking layers and the ultra-thin nWF layer of the GAA structure in the nMOS region are formed using four steps in-situ processes to prevent oxidation of the ultra-thin nWF layer. Therefore, the semiconductor devices of the embodiments of the disclosure can achieve ultra-low nMOS Vt tuning with an ultra-thin nWF layer in the GAA structure.

According to embodiments of the disclosure, a first oxygen blocking layer is formed under an ultra-thin n-type work function (nWF) layer, and a second oxygen blocking layer is formed on the ultra-thin nWF layer. The native oxide on the first oxygen blocking layer is removed using a dry etching process in a process chamber before forming the ultra-thin nWF layer. Next, the ultra-thin nWF layer is in-situ deposited on the first oxygen blocking layer in the process chamber. Afterward, the second oxygen blocking layer is in-situ formed on the ultra-thin nWF layer in the process chamber. The first and second oxygen blocking layers and the ultra-thin nWF layer are in-situ formed in the same process chamber. Therefore, the ultra-thin nWF layer is prevented from oxidation to achieve ultra-low nMOS threshold voltage (Vt) for the semiconductor devices. Moreover, the first and second oxygen blocking layers are thin enough to fill in the spaces between nano-sheets and do not adversely affect the process window of forming metal gate of the GAA structure.

The foregoing broadly outlines some aspects of the embodiments described herein. Some embodiments described herein are described in the context of FinFET devices, and more particularly, in the context of forming a GAA structure of the FinFET devices. The GAA structure includes an ultra-thin nWF layer sandwiched between oxygen blocking layers. The oxygen blocking layers and the ultra-thin nWF layer are in-situ formed in the same process chamber to prevent oxidation of the ultra-thin nWF layer. Some variations of the exemplary methods and structures are described. A person having ordinary skill in the art will readily understand other modifications may be made that are contemplated within the scope of other embodiments. Implementations of some aspects of the present disclosure may be used in other processes and/or in other devices. Throughout the various views and illustrative embodiments, like reference numbers are used to designate like elements. Although embodiments of the method may be described in a particular order, various other embodiments of the method may be performed in any logical order and may include fewer or more steps than what is described herein.

FIG. 1 illustrates a plane view of an intermediate structure at one stage of an exemplary method for fabricating a semiconductor device 100 such as a FinFET device, in accordance with some embodiments. The semiconductor device 100 includes multiple dummy gate structures 120 formed on and across multiple fin structures 106 in an nMOS region 100A, and multiple dummy gate structures 130 formed on and across multiple fin structures 108 in a pMOS region 100B. The fin structures 106 and 108 are separated from each other by isolation structures 104. The fin structures 106 and 108, the dummy gate structures 120 and 130, and the isolation structures 104 are formed on a substrate 102. Other aspects not illustrated in or described with respect to FIG. 1 may become apparent from the following figures and description. The structure in FIG. 1 may be electrically connected or coupled in a manner to operate one or more transistors, for example eight transistors in each of the nMOS and pMOS regions.

Figure 2:
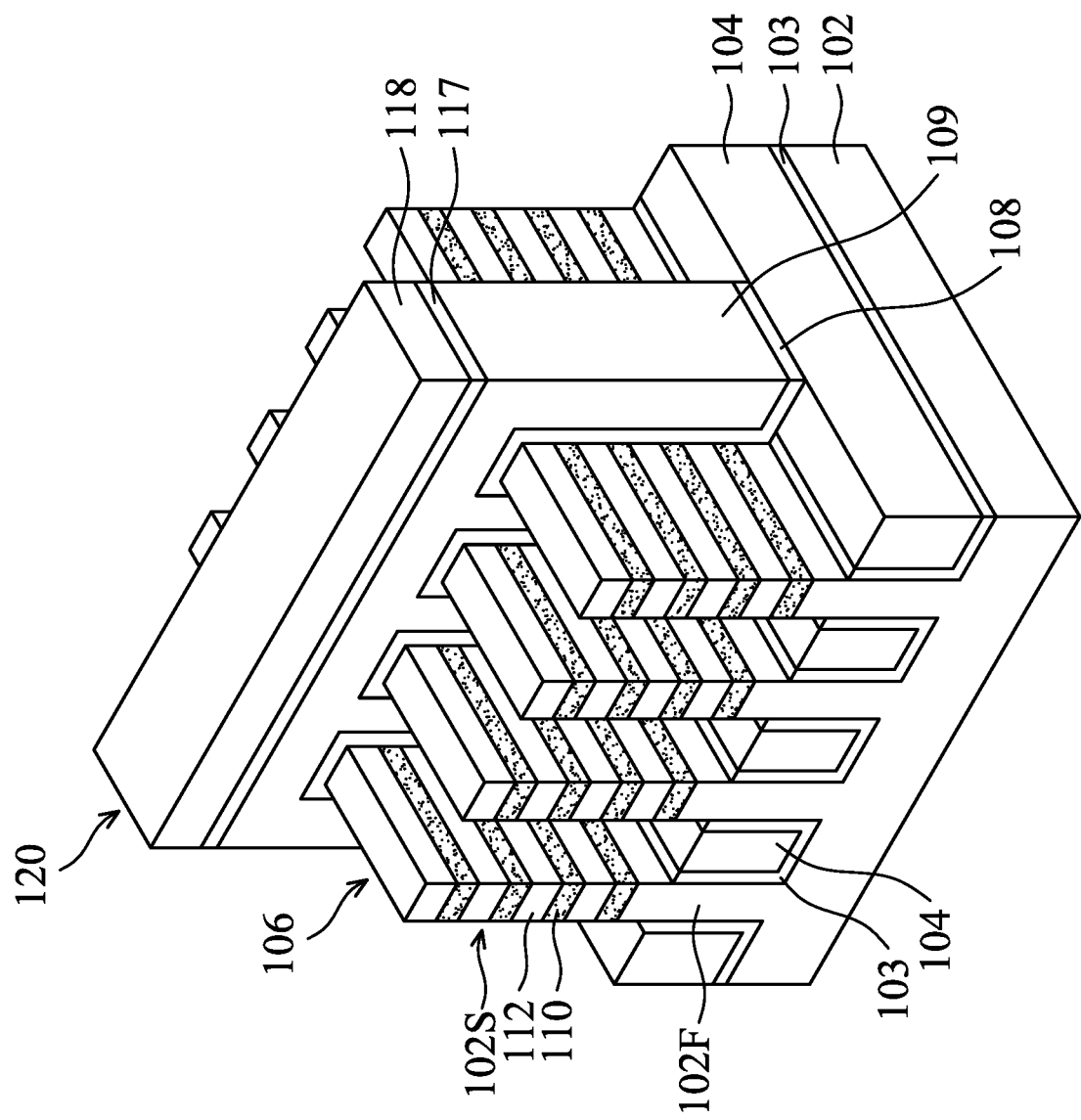
FIG. 2 shows a perspective view of an intermediate structure at one stage of an exemplary method for fabricating a semiconductor device, in accordance with some embodiments.

FIG. 2 illustrates a perspective (three-dimensional) view of an intermediate structure at one stage of an exemplary method for fabricating a semiconductor device, in accordance with some embodiments. The structure of FIG. 2 illustrates a portion of the semiconductor device 100 of FIG. 1 in the nMOS region 100A. A portion of the semiconductor device 100 of FIG. 1 in the pMOS region 100B may also have the same perspective view as shown in FIG. 2. In some embodiments, multiple fin structures 106 protruding from a substrate 102. Each of the fin structures 106 includes a fin 102F and a stack of alternating semiconductor layers 110 and 112 on the fin 102F. In some examples, the total number of layers in the stack of semiconductor layers 110 and 112 is between three and ten. For example, there may be eight layers. In some examples, the total thickness of the stacked semiconductor layers 110 and 112 is in a range from about 60 nm to about 80 nm.

The substrate 102 may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The substrate 102 may be made of silicon or another semiconductor material. For example, the substrate 102 is a silicon wafer. In some examples, the substrate 102 is made of a compound semiconductor such as silicon germanium (SiGe), silicon carbide (SiC), gallium arsenic (GaAs), indium arsenide (InAs), or indium phosphide (InP). In some examples, the substrate 102 is made of an alloy semiconductor such as GaAsP, AlInAs, AlGaAs, GaInAs, GaInP, or GaInAsP.

The semiconductor layers 110 and 112 are made of different materials such as silicon, germanium, silicon germanium (SiGe), gallium arsenic (GaAs), indium arsenide (InAs), silicon carbide (SiC), or InGaAs. In some embodiments, the semiconductor layers 110 are made of SiGe, and the semiconductor layers 112 are made of Si. The semiconductor layer 110 or the semiconductor layer 112 may be firstly formed on the substrate 102. The semiconductor layers 110 and 112 are blanketly formed on the substrate 102 independently by epitaxial growth process.

The substrate 102 and the blanketly formed stacked semiconductor layers 110 and 112 are patterned together using photolithography and etching processes to form multiple trenches in the substrate 102 and in the stacked semiconductor layers 110 and 112. A patterned hard mask (not shown) is formed on the stacked semiconductor layers 110 and 112 to serve as an etching mask for forming the fin structures 106. Each of the trenches is between neighboring pairs of fin structures 106. The fin structure 106 includes a fin 102F and a fin stack 102S on the fin 102F. The fin 102F is formed from the substrate 102. The fin stack 102S is formed from the stacked semiconductor layers 110 and 112. The etching process may include a reactive ion etch (RIE), neutral beam etch (NBE), inductive coupled plasma (ICP) etch, or a combination thereof.

Still referring to FIG. 2, multiple isolation structures 104 are formed in the trenches between the fins 102F and on the substrate 102, in accordance with some embodiments. Each of the fins 102F may protrude above the isolation structures 104. The isolation structure 104 is, for example a shallow-trench-isolation (STI) structure, which surrounds the bottom portion of the fin 102F. The isolation structure 104 is formed by filling the trenches with an insulating material and then the filled insulating material is recessed by an etching process. The insulating material is such as silicon oxide, silicon nitride, silicon oxynitride, fluoride-doped silicate glass (FSG), or another low dielectric constant (low-k) dielectric material. The trenches may be filled with the insulating material using a deposition process, such as chemical vapor deposition (CVD), flowable CVD (FCVD), a spin-on-glass (SOG) process, or another applicable process.

In addition, a liner 103 may be formed between the isolation structures 104 and the substrate 102, and also between the isolation structures 104 and the fins 102F. A liner material layer for forming the liner 103 is conformally deposited on the sidewalls of the fin structures 106, and on the top surfaces of the fin stacks 102S and the substrate 102 before filling the trenches with the insulating material. The material of the liner 103 may be silicon oxide, silicon nitride or silicon oxynitride. The liner material layer may be deposited using CVD, physical vapor deposition (PVD) or atomic layer deposition (ALD) process. Next, the liner material layer is recessed together with the filled insulating material of the isolation structures 104 by an etching process to form the liner 103. The etching process includes RIE, NBE or another suitable etching process. In some instances, the top surfaces of the isolation structure 104 and the liner 103 are lower than or at the same level with the top surfaces of the fins 102F.

Still referring to FIG. 2, the dummy gate structure 120 is formed across the fin structures 106, along the sidewalls and over the top surfaces of the fin structures 106, in accordance with some embodiments. The dummy gate structure 120 is also formed on the isolation structures 104. The longitudinal direction of the dummy gate structure 120 is perpendicular to the longitudinal direction of the fin structures 106. In some embodiments of the disclosure, each of the dummy gate structures 120 will be replaced with a replacement gate structure in a gate-last process to form a gate-all-around (GAA) structure in the nMOS region 100A.

The dummy gate structure 130 is also formed across the fin structures 108, along the sidewalls and over the top surfaces of the fin structures 108. The dummy gate structure 130 is also formed on the isolation structures 104. The longitudinal direction of the dummy gate structure 130 is perpendicular to the longitudinal direction of the fin structures 108. In some embodiments of the disclosure, each of the dummy gate structures 130 will be replaced with a replacement gate structure in a gate-last process to form a GAA structure in the pMOS region 100B. The materials and processes of forming the GAA structures in the nMOS region 100A and the pMOS region 100B would be described with reference to FIGS. 3A to 3M.

Each of the dummy gate structures 120 and 130 includes a dummy gate dielectric layer 108 and a dummy gate electrode layer 109 on the dummy gate dielectric layer 108. In some embodiments, the dummy gate electrode layer 109 is made of poly-silicon. The dummy gate dielectric layer 108 may be made of silicon oxide, silicon nitride, silicon oxynitride or another low dielectric constant (low-k) dielectric material. The dummy gate dielectric layer 108 and the dummy gate electrode layer 109 are deposited independently and then may be patterned together using photolithography and etching processes to from the dummy gate structures 120 and 130. The deposition processes for the dummy gate dielectric layer 108 and the dummy gate electrode layer 109 may include CVD, PVD, ALD, high density plasma CVD (HDPCVD), metal organic CVD (MOCVD), or plasma enhanced CVD (PECVD) process. The etching processes for forming the dummy gate structures 120 and 130 may include RIE, NBE or another suitable etching process.

A first hard mask 117 and a second hard mask 118 are patterned and formed on the dummy gate electrode layer 109 to serve as an etching mask for forming the dummy gate structures 120 and 130. In some examples, the first hard mask 117 is made of silicon carbon nitride (SiCN), silicon oxycarbide (SiOC), silicon oxycarbon nitride (SiOCN) or silicon nitride (SiN or $Si_3N_4$). The second hard mask 118 may be made of silicon oxide ($SiO_2$). The first hard mask 117 and the second hard mask 118 are formed using deposition, photolithography and etching processes.

Figure 3A:
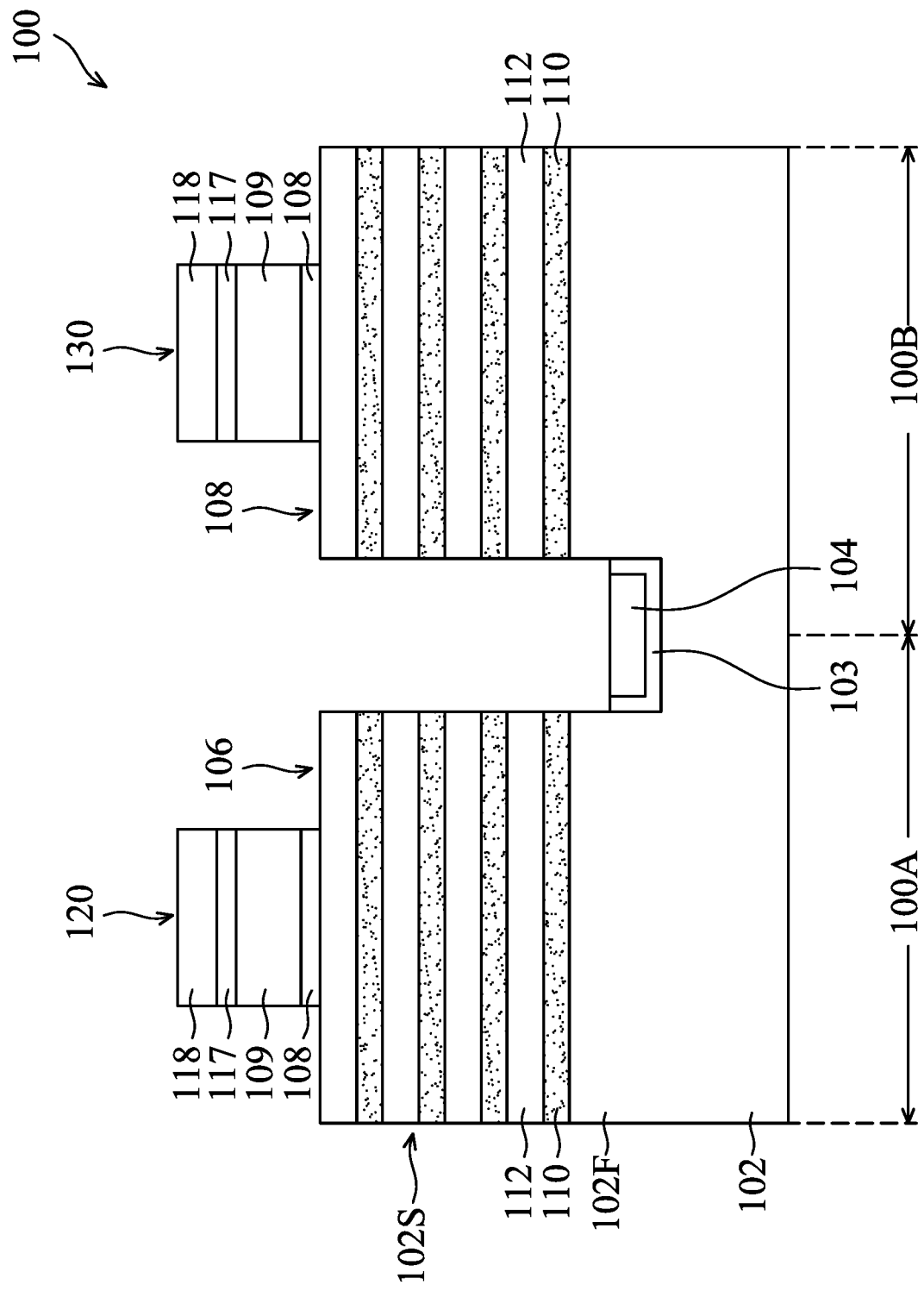
FIGS. 3A, 3B, 3C, 3D, 3E, 3F, 3G, 3H, 3I, 3J, 3K, 3L and 3M show cross-sectional views of respective structures at various stages of an exemplary method for fabricating a semiconductor device taken along line I-I' in FIG. 1, in accordance with some embodiments.

FIGS. 3A, 3B, 3C, 3D, 3E, 3F, 3G, 3H, 3I, 3J, 3K, 3L and 3M show cross-sectional views of respective structures at various stages of an exemplary method for fabricating a semiconductor device 100 taken along line I-I' in FIG. 1, in accordance with some embodiments. Line I-I' is on a plane that is perpendicular to the dummy gate structures 120 and 130, and along the fin structures 106 and 108. Referring to FIG. 3A, the dummy gate structure 120 is formed on the fin structure 106, and the dummy gate structure 130 is formed on the fin structure 108, in accordance with some embodiments. The various features as shown in FIG. 3A are the same as or similar to those described with respect to FIGS. 1 and 2.

Figure 3B:
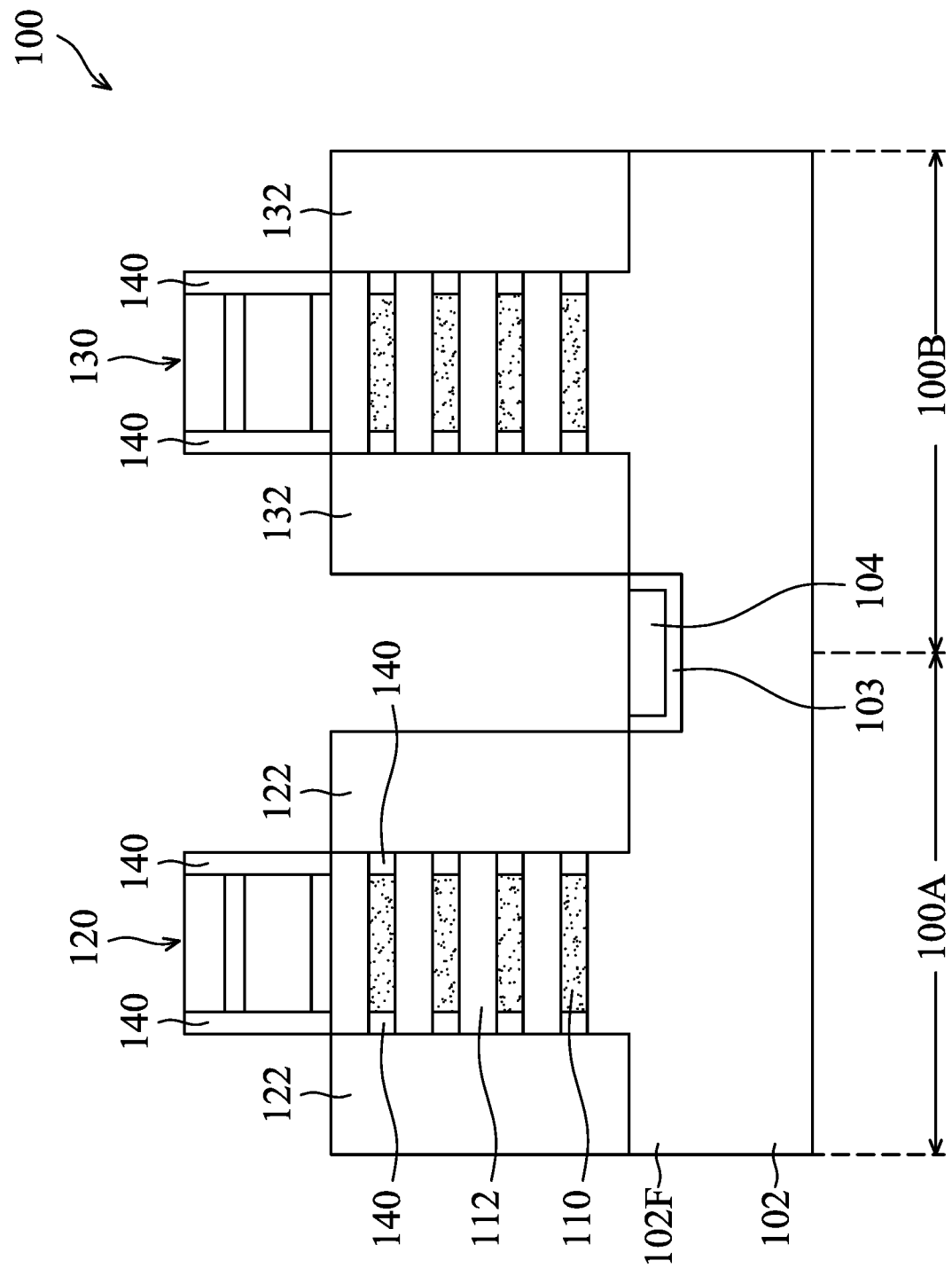

Next, referring to FIG. 3B, gate spacers 140 are formed along the sidewalls of the dummy gate structures 120 and 130, in accordance with some embodiments. In addition, the gate spacers 140 are also formed on the sidewalls of the etched semiconductor layers 110. In some embodiments, the semiconductor layers 110 at source and drain regions are etched using the dummy gate structures 120 and 130 as etching mask. The semiconductor layers 110 are etched by an etching process such as plasma etching, RIE or another dry etching process. The gate spacers 140 may be formed by conformally depositing one or more spacer layers on the dummy gate structures 120 and 130, along the sidewalls of the etched semiconductor layers 110, and on the isolation structures 104. The spacer layers may be made of different materials and have different thicknesses than each other. The one or more spacer layers may include silicon oxide ($SiO_2$), silicon nitride (SiN or $Si_3N_4$), silicon oxynitride (SiON), silicon carbon nitride (SiCN), or a combination thereof, and may be deposited by CVD, ALD or another deposition process. The spacer layers are then anisotropically etched to form the gate spacers 140. The etching process may include a RIE, NBE, or another etching process.

Afterwards, the semiconductor layers 112 of the fin structure 106 at source and drain regions are etched using the dummy gate structure 120 and the gate spacers 140 as etching mask to form recesses. Also, the semiconductor layers 112 of the fin structure 108 at source and drain regions are etched using the dummy gate structure 130 and the gate spacers 140 as etching mask to form recesses. The recesses may be formed using an isotropic etching process such as plasma etching, RIE or another dry etching process. Alternatively, the isotropic etching process may be a wet etching process that uses an etching solution such as ammonium hydroxide-peroxide water mixture (APM), tetramethylammonium hydroxide (TMAH), ammonium hydroxide ($NH_4OH$), or another etchant. The bottom surfaces of the recesses may be lower than the top surface of the fins 102F.

Next, still referring to FIG. 3B, source and drain structures 122 are formed in the recesses and on opposite sides of the dummy gate structure 120 in the nMOS region 100A, in accordance with some embodiments. Also, source and drain structures 132 are formed in the recesses and on opposite sides of the dummy gate structure 130 in the pMOS region 100B. In some instances, the top surfaces of the epitaxial source and drain structures 122 and 132 may be higher than or at the same level with the top surfaces of the fin structures 106 and 108.

The source and drain structures 122 in the nMOS region 100A and the source and drain structures 132 in the pMOS region 100B may be made of different epitaxial semiconductor materials. The epitaxial semiconductor materials include silicon germanium ($SiGe_{1-x}$, where x can be between approximately 0 and 1), silicon carbide (SiC), silicon phosphorus, germanium, an III-V compound semiconductor, an II-VI compound semiconductor, or another epitaxial semiconductor. The materials of an III-V compound semiconductor may include InAs, AlAs, GaAs, InP, GaN, InGaAs, InAlAs, GaSb, AlSb, AlP or GaP. In some examples, the source and drain structures 122 in the nMOS region 100A are made of SiC, and the source and drain structures 132 in the pMOS region 100B are made of SiGe. The source and drain structures 122 and the source and drain structures 132 may be independently formed by metal-organic CVD (MOCVD), molecular beam epitaxy (MBE), liquid phase epitaxy (LPE), vapor phase epitaxy (VPE), selective epitaxial growth (SEG), or a combination thereof. In addition, the source and drain structures 122 and the source and drain structures 132 may be independently doped by in-situ doping during the epitaxial growth and/or by implantation after the epitaxial growth.

Moreover, some source and drain structures 122 in the nMOS region 100A may be shared between two neighboring transistors, such as through coalescing the structures by epitaxial growth. Also, some source and drain structures 132 in the pMOS region 100B may be shared between two neighboring transistors, such as through coalescing the structures by epitaxial growth. For example, the neighboring FinFETs with the shared source and drain structures may be implemented as two functional transistors. Other configurations in other examples may implement other numbers of functional transistors.

Figure 3C:
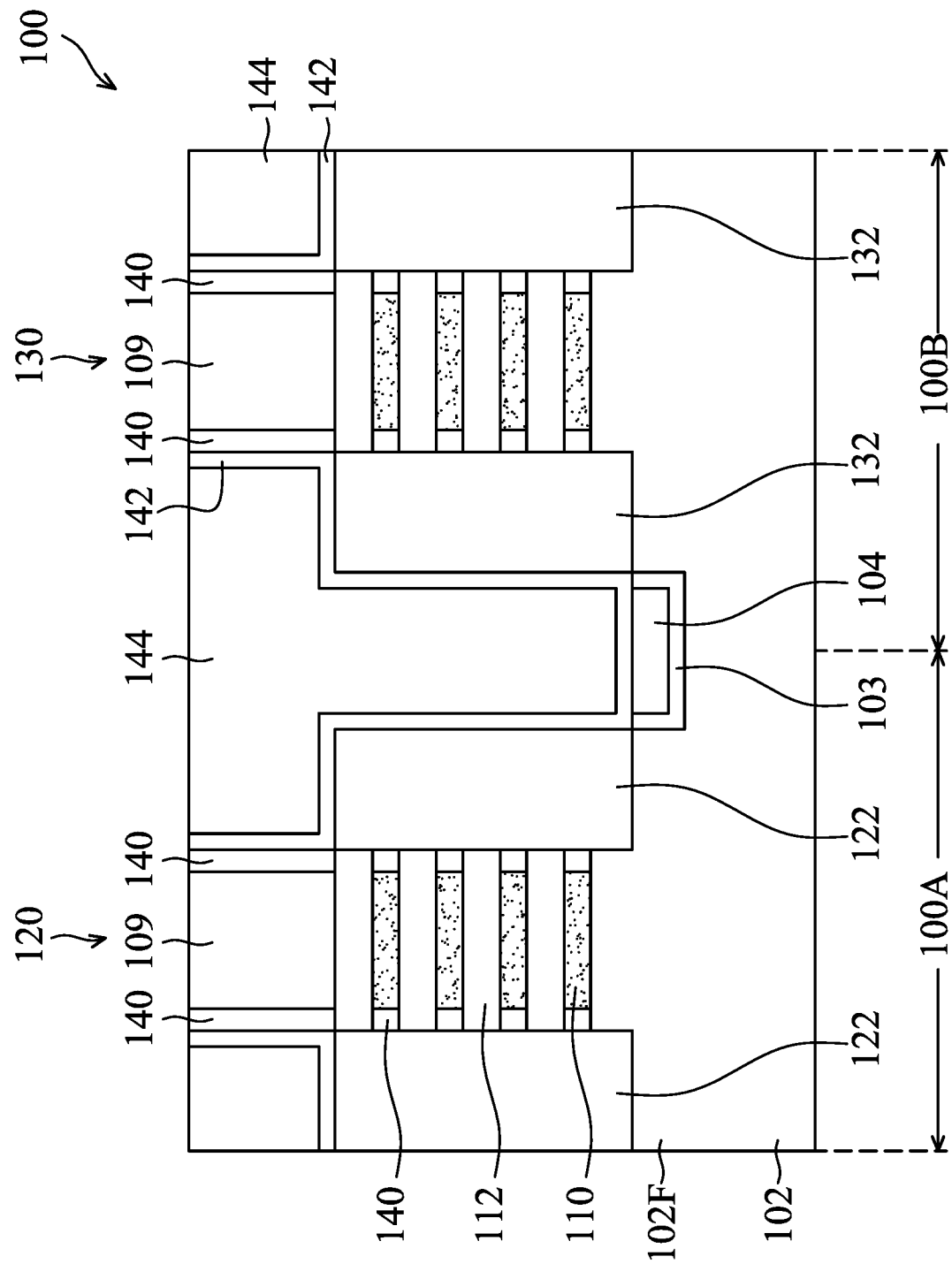

Next, referring to FIG. 3C, a contact etch stop layer (CESL) 142 and an interlayer dielectric (ILD) layer 144 are formed on the source and drain structures 122, the source and drain structures 132 and on the isolation structure 104, in accordance with some embodiments. The CESL 142 is conformally deposited on the dummy gate structures 120 and 130, the gate spacers 140, the source and drain structures 122, the source and drain structures 132, and the isolation structure 104. The ILD layer 144 is deposited on the CESL 142.

Generally, the CESL 142 can provide a mechanism to stop an etching process when forming via contacts to the source and drain structures 122 and 132. The CESL 142 may be formed of a dielectric material having a different etch selectivity from the adjacent ILD layer 144. The material of the CESL 142 may include silicon nitride (SiN or $Si_3N_4$), silicon carbon nitride (SiCN) or a combination thereof, and may be deposited by CVD, PECVD, ALD, or another deposition process. In some examples, the CESL 142 has a thickness in a range from about 2 nm to about 5 nm. The material of the ILD layer 144 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD layer 144 may be deposited by spin-on coating, CVD, Flowable CVD (FCVD), PECVD, PVD, or another deposition process.

Afterwards, a planarization process, for example a chemical mechanical polishing (CMP) process, is performed on the ILD layer 144 and the CESL 142. The first hard masks 117, the second hard masks 118 and portions of the gate spacers 140 are also removed in the planarization process. After the planarization process, the dummy gate electrode layers 109 are exposed. The top surfaces of the ILD layer 144 and the CESL 142 may be coplanar with the top surfaces of the dummy gate electrode layers 109 and the gate spacers 140.

Figure 3D:
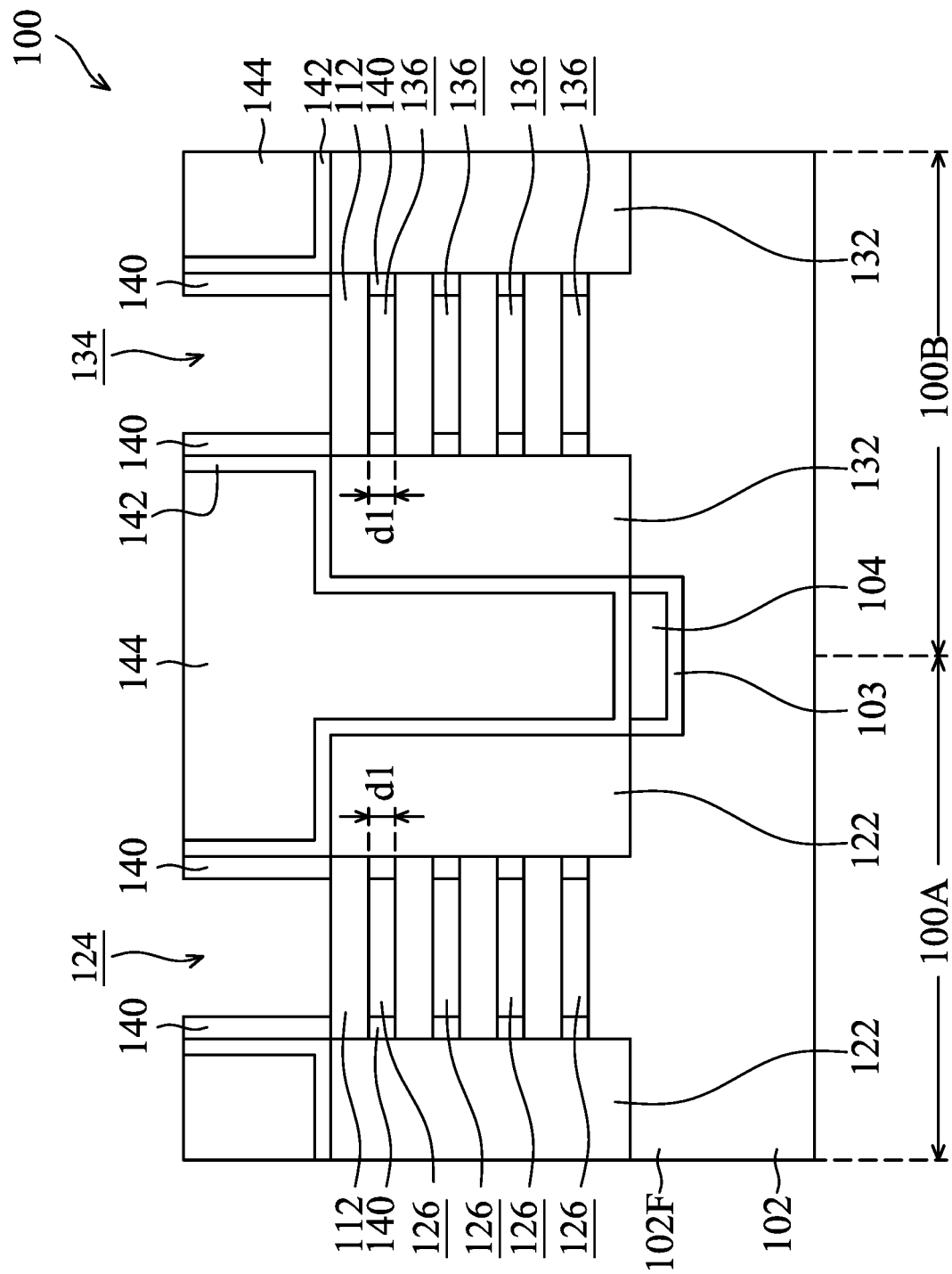

Referring to FIG. 3D, the dummy gate electrode layers 109, the dummy gate dielectric layers 108 and the semiconductor layers 110 (FIG. 3C) are removed using one or more etching processes, in accordance with some embodiments. Thereafter, in the nMOS region 100A, a trench 124 is formed between the gate spacers 140 and multiple spaces 126 are formed between the gate spacers 140. Each of the space 126 is between the semiconductor layers 112. Also, in the pMOS region 100B, a trench 134 is formed between the gate spacers 140 and multiple spaces 136 are formed between the gate spacers 140. Each of the space 136 is between the semiconductor layers 112. In some embodiments, each of the spaces 126 and 136 between the neighboring semiconductor layers 112 has a height d1 that is in a range from about 8 nm to about 10 nm. The semiconductor layers 112 are separated from each other by a distance that is in a range from about 8 nm to about 10 nm. Each of the semiconductor layers 112 has a thickness that is in a range from about 8 nm to about 10 nm. The semiconductor layers 112 may be referred to as nanosheets or nanowires. The spaces 126 and 136 may also be referred to as sheet-sheet spacing. The semiconductor layers 112 serve as channel layers of the semiconductor device 100.

Next, FIGS. 3E to 3M show cross-sectional views of a portion of respective structures at various stages of an exemplary method for fabricating the semiconductor device 100 taken along line I-I' in FIG. 1, in accordance with some embodiments. In the cross-sectional views of FIGS. 3E to 3M, the dimensions of various features may not be drawn to scale and may be arbitrarily increased or reduced for clarity of illustration.

Figure 3E:
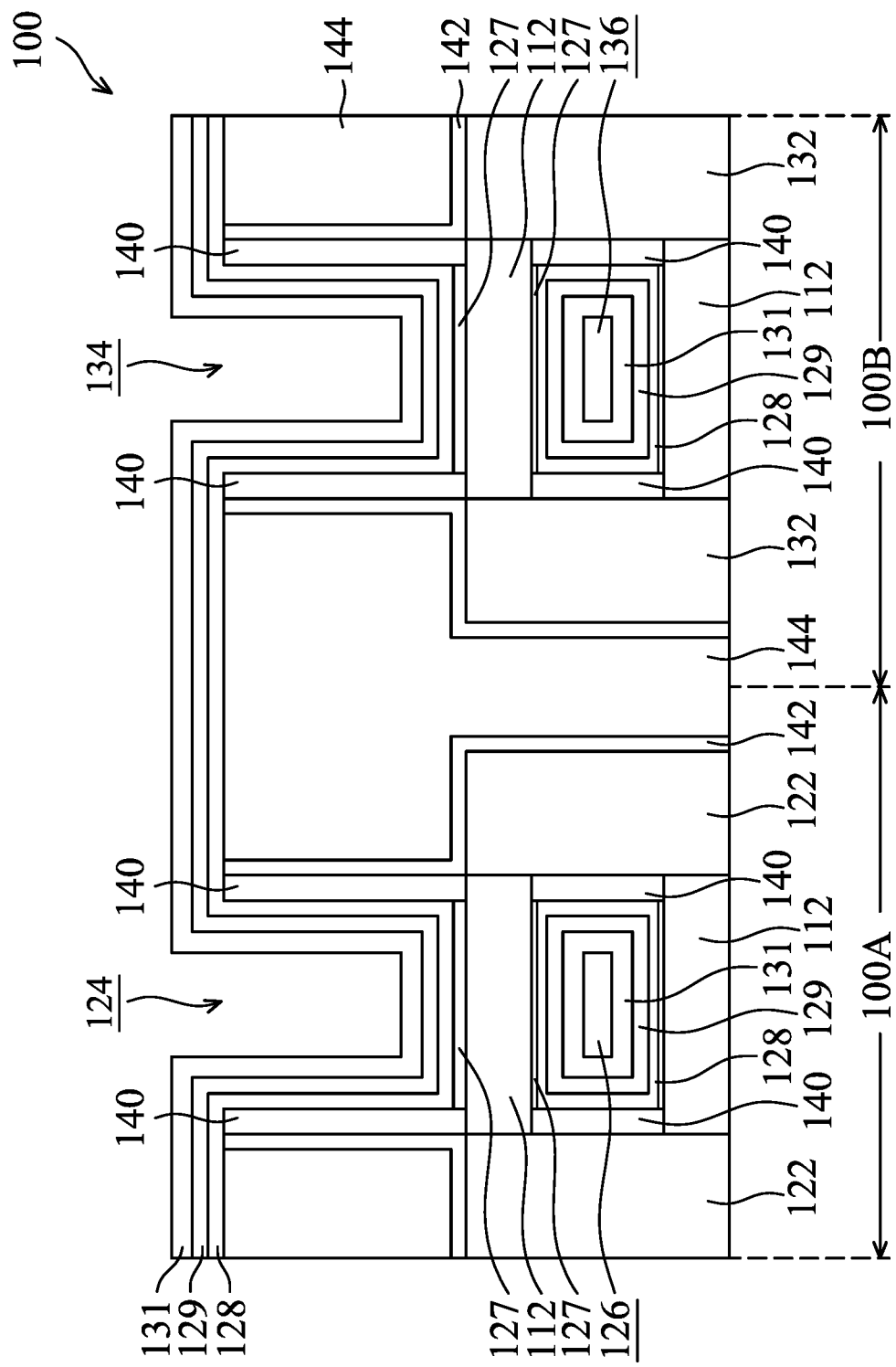

Referring to FIG. 3E, an interfacial layer (IL) 127 is formed on and around the semiconductor layers 112 in the trenches 124 and 134 and in the spaces 126 and 136, in accordance with some embodiments. The interfacial layer 127 may be silicon oxide and formed by deposition, chemical oxidation or thermal oxidation process. In some examples, the interfacial layer 127 is silicon oxide which is formed using ozone ($O_3$) with standard clean 1 (SC1) and standard clean 2 (SC2) processes. The interfacial layer 127 has a thickness that may be in a range from about 5 Å to about 15 Å.

Next, a gate dielectric layer 128 is conformally deposited on the ILD layer 144, the CESL 142, the gate spacers 140 and the interfacial layer (IL) 127, in the trenches 124 and 134 and in the spaces 126 and 136. The gate dielectric layer 128 also surrounds the semiconductor layers 112. The gate dielectric layer 128 includes silicon oxide, silicon nitride, a high-k dielectric material, multilayers thereof, or other dielectric material. The high-k dielectric material may have a k-value greater than about 7.0. The high-k dielectric material may include a metal oxide of or a metal silicate of Hf, Al, Zr, La, Mg, Ba, Ti, Pb, or a combination thereof. The gate dielectric layer 128 may be deposited by ALD, PECVD, molecular-beam deposition (MBD), or another deposition process. The gate dielectric layer 128 may be a high-k gate dielectric layer. For example, the gate dielectric layer 128 is $HfO_2$ that is deposited by ALD process using $HfCl_4$ and $H_2O$ as precursor. In some examples, the gate dielectric layer 128 has a thickness that is in a range from about 10 Å to about 20 Å.

Next, a capping layer 129 is conformally deposited on the gate dielectric layer 128 in the trenches 124 and 134 and in the spaces 126 and 136. In some examples, the capping layer 129 is TiSiN that is deposited by ALD process using $TiCl_4$, $SiH_4$ and $NH_3$ as precursor. The capping layer 129 has a thickness that may be in a range from about 10 Å to about 20 Å. Afterwards, an in-situ post-metal anneal (iPMA) process is performed on the capping layer 129 in the nMOS region 100A and the pMOS region 100B to reduce oxygen vacancy in the gate dielectric layer 128. The iPMA process may be performed at a temperature in a range from about 850° C. to about 950° C. with spike annealing in an $N_2$ ambient.

Next, another capping layer 131 is conformally deposited on the capping layer 129 in the trenches 124 and 134 and in the spaces 126 and 136. In some example, the capping layer 131 is Si that is deposited by CVD process using $Si_2H_6$ and $H_2$ as precursor at a temperature in a range from about 350° C. to about 450° C. The capping layer 131 has a thickness that may be in a range from about 20 Å to about 50 Å. Afterwards, an post-cap anneal (PCA) process is performed on the capping layer 131 in the nMOS region 100A and the pMOS region 100B to enhance the film quality of the gate dielectric layer 128. The PCA process may be performed at a temperature in a range from about 900° C. to about 950° C. with spike annealing in an $N_2$ ambient.

Figure 3F:
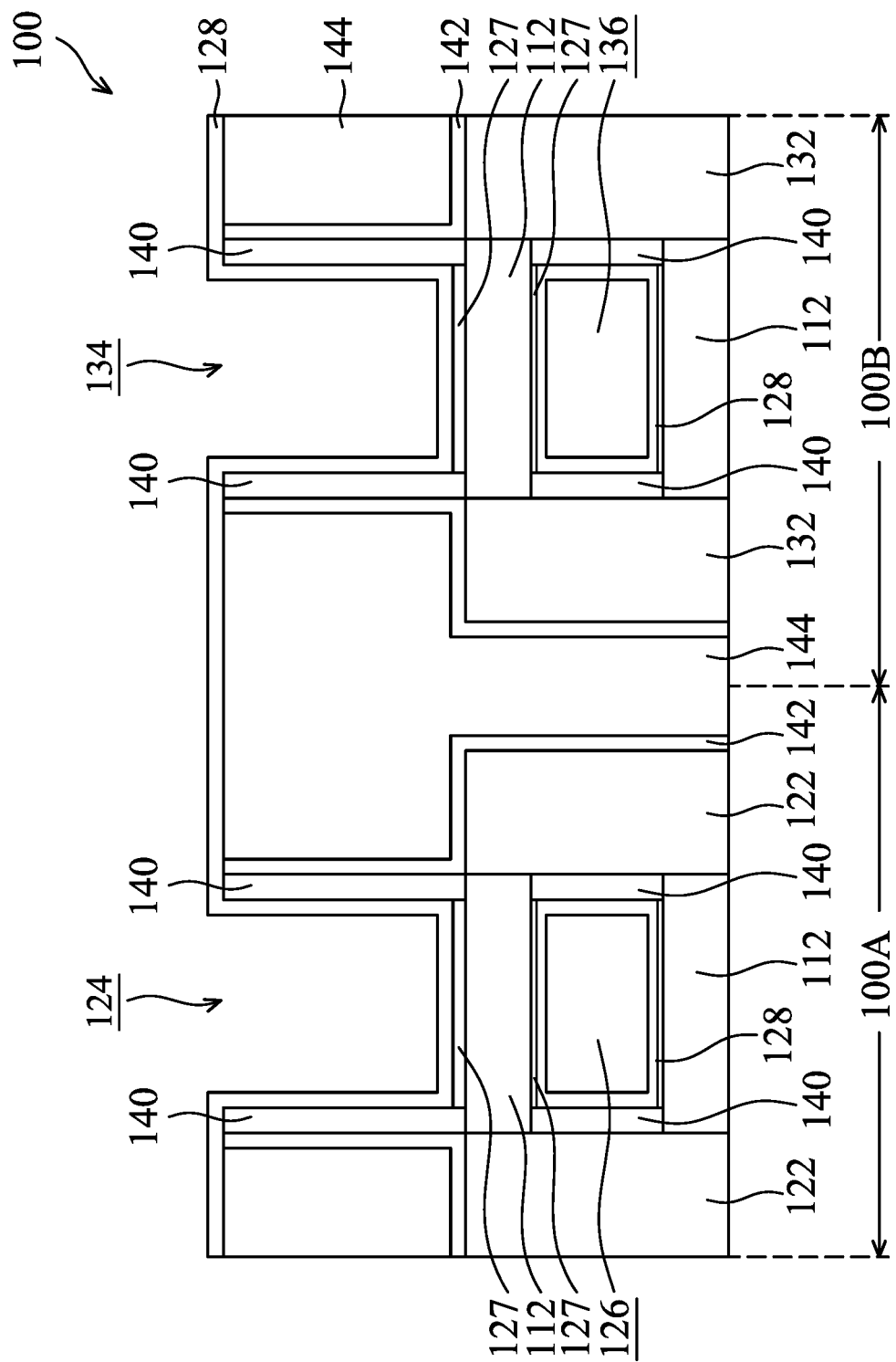

Afterwards, referring to FIG. 3F, the capping layer 131 is removed and then the capping layer 129 is also removed, in accordance with some embodiments. The capping layers 131 and 129 may be removed using different etching processes. The removal of the capping layers 131 and 129 can increase the filling space for a subsequently forming metal gate. After the capping layers 131 and 129 are removed, a post-deposition anneal (PDA) process is performed in the nMOS region 100A and the pMOS region 100B to further improve the film quality of the gate dielectric layer 128. The PDA process may be performed at a temperature in a range from about 850° C. to about 950° C., for example 890° C., with spike annealing in an $NH_3$ ambient.

Figure 3G:
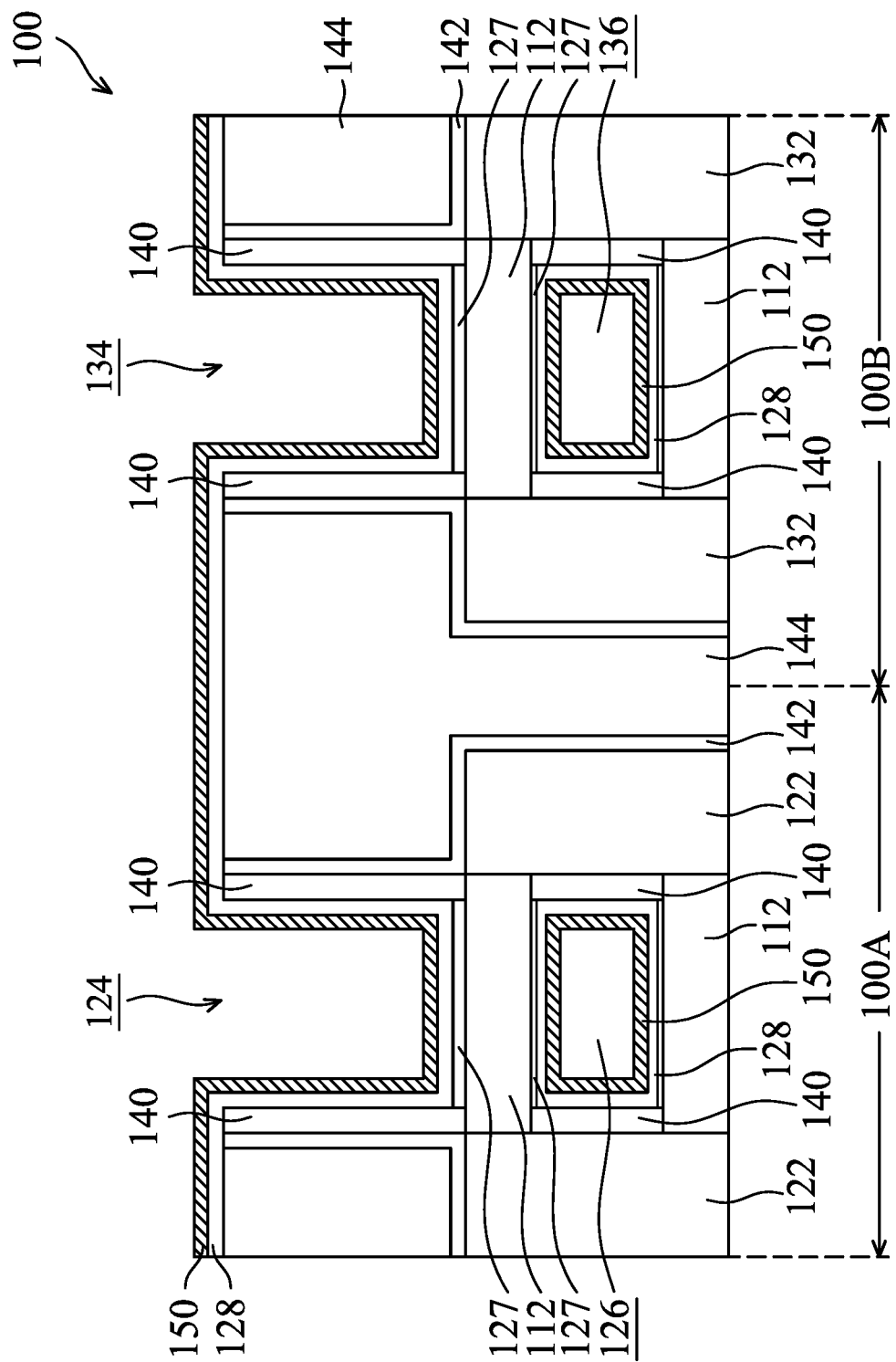

Next, referring to FIG. 3G, a blocking layer 150 is conformally deposited on the gate dielectric layer 128 in the trenches 124 and 134 and in the spaces 126 and 136, in accordance with some embodiments. The blocking layer 150 also surrounds the semiconductor layers 112. The blocking layer 150 includes TaN, TiN, TaAlN, TiAlN, TaSiN, TiSiN or AlN. In some embodiments, the blocking layer 150 is TaN that is deposited by ALD process using pentakis (dimethylamino) tantalum (PDMAT) and $NH_3$ as precursor and is performed at a temperature in a range from about 225° C. to about 325° C. In some examples, the deposited blocking layer 150 has a thickness that is in a range from about 7 Å to about 10 Å.

Figure 3H:
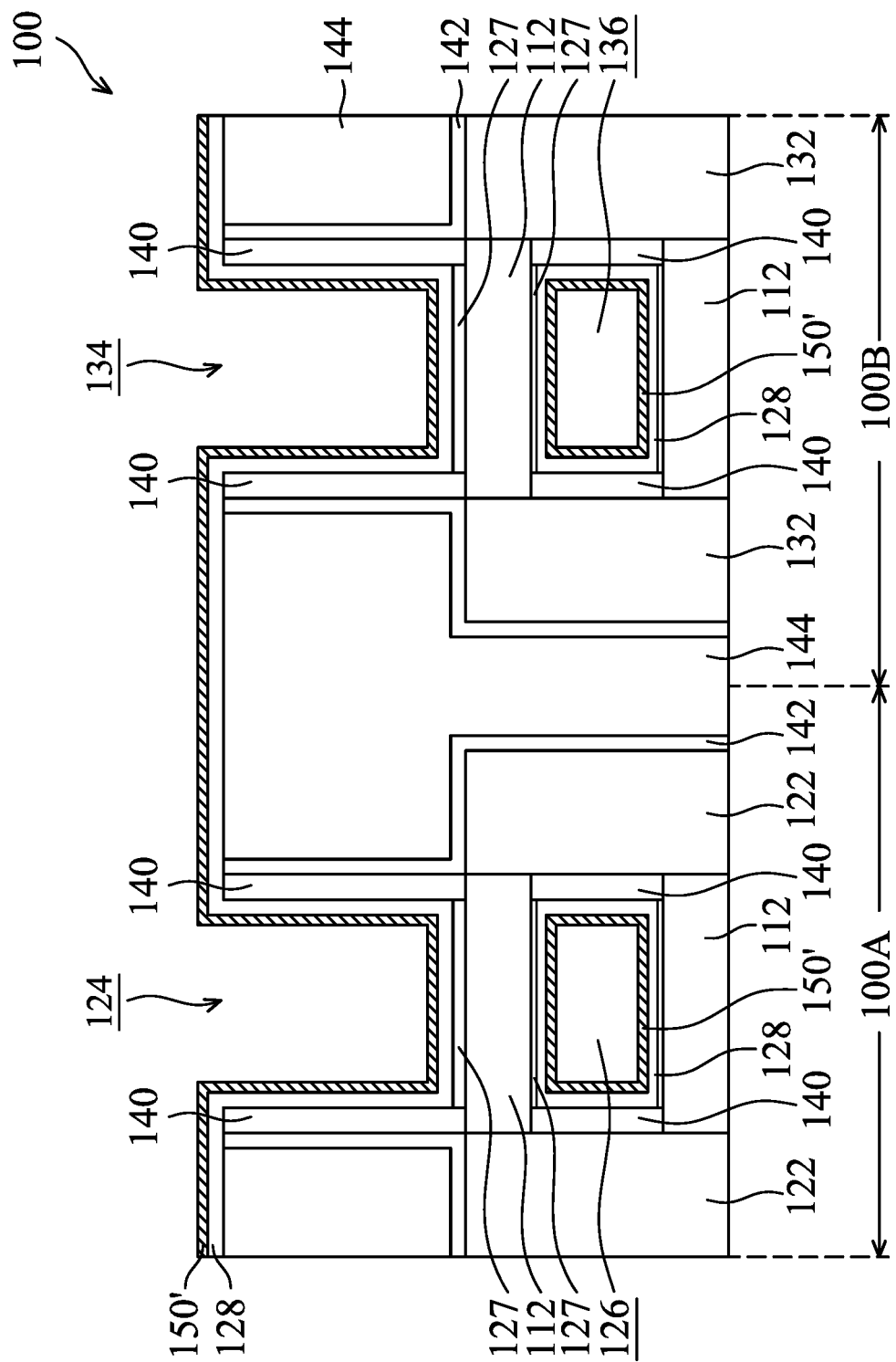

Afterwards, referring to FIG. 3H, the deposited blocking layer 150 is etched back to be a thin blocking layer 150', in accordance with some embodiments. In some embodiments, the blocking layer 150 is TaN. The partial removal of the blocking layer 150 is performed using $WCl_5$ as etching gas at a temperature in a range from about 300° C. to about 500° C. In some examples, after the etch-back process, the thin blocking layer 150' has a thickness that is in a range from about 5 Å to about 6 Å. The partial removal of the blocking layer 150 can increase the filling space of a metal gate.

During the fabrication processes, native oxide may form on the thin blocking layer 150'. According to embodiments of the disclosure, the native oxide may be removed from the thin blocking layer 150' using a dry etching process in a process chamber before forming an n-type work function layer. In some embodiments, the thin blocking layer 150' is TaN and the native oxide of TaN is TaON. The TaON may be removed using $WCl_5$ or $TaCl_5$ as etching gas at a temperature in a range from about 300° C. to about 500° C. and at a total pressure in a range from about 5 torr to about 15 torr. In some examples, after the native oxide is removed, the thin blocking layer 150' has a thickness from about 1 Å to about 2 Å. The thin blocking layer 150' is also referred to as a first oxygen blocking layer that can prevent a subsequently forming n-type work function layer from oxidation.

Figure 3I:
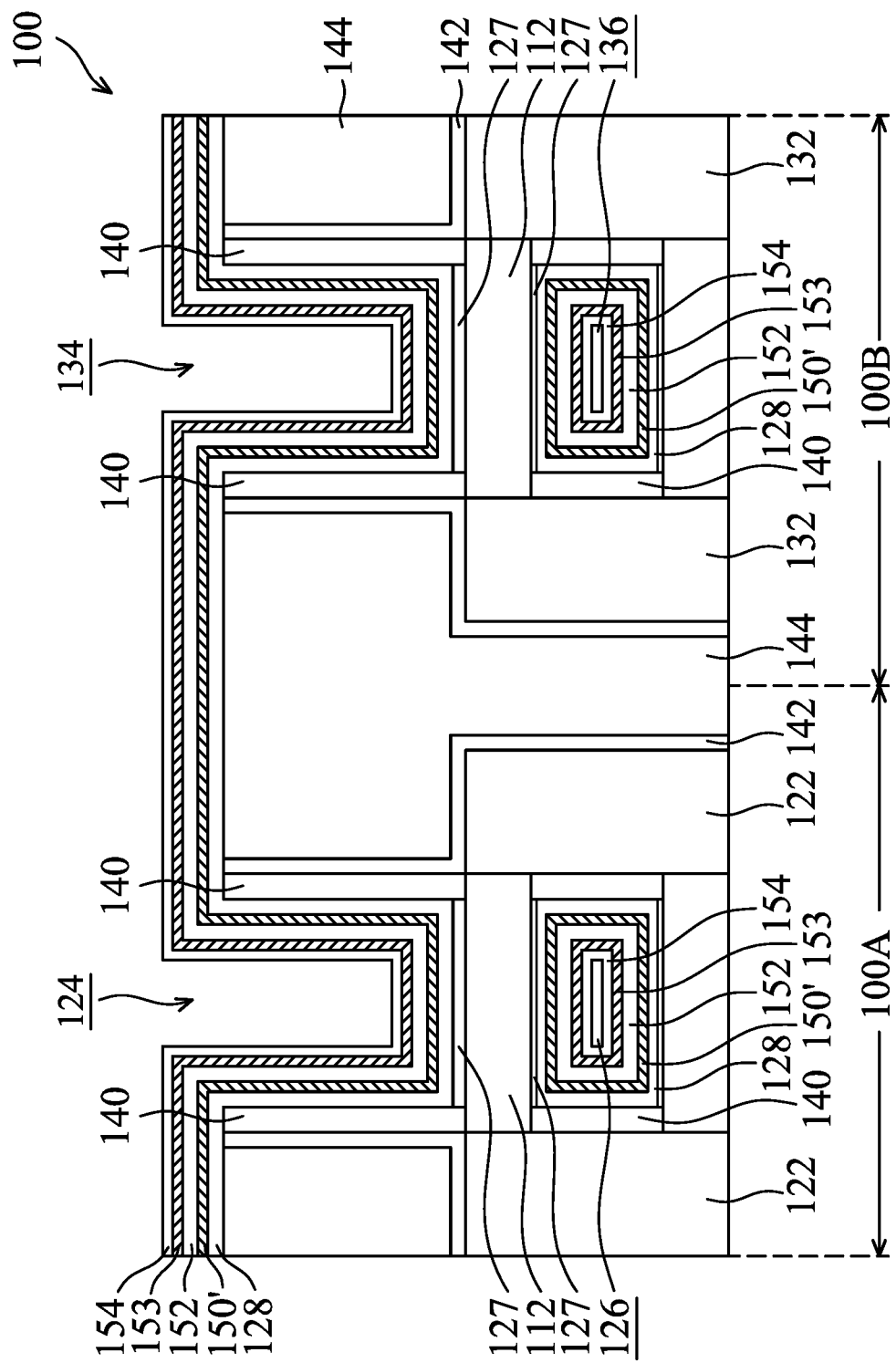

Next, referring to FIG. 3I, an n-type work function (nWF) layer 152 is conformally deposited on the thin blocking layer 150' in the trenches 124 and 134 and in the spaces 126 and 136, in accordance with some embodiments. The nWF layer 152 also surrounds the semiconductor layers 112. The nWF layer 152 includes TiAlC, TiAl, TaAlC or TaC, and serves the Vt tuning of nMOS. The nWF layer 152 is in-situ deposited by ALD process that is performed in the same process chamber as the removal of the native oxide from the thin blocking layer 150'. In some embodiments, the nWF layer 152 is TiAlC that is deposited by ALD process using $TiCl_4$ and triethyl aluminium (TEAL) as precursor and is performed at a temperature in a range from about 350° C. to about 450° C., or from about 350° C. to about 425° C. In some examples, the nWF layer 152 has a thickness in a range from about 10 Å to about 20 Å. The thickness of the nWF layer 152 can be adjusted by varying the number of cycles in the ALD process.

Still referring to FIG. 3I, a capping layer 153 is conformally deposited on the nWF layer 152 in the trenches 124 and 134 and in the spaces 126 and 136, in accordance with some embodiments. The capping layer 153 also surrounds the semiconductor layers 112. The capping layer 153 is in-situ deposited by ALD process performed in the same process chamber as the deposition of the nWF layer 152. The capping layer 153 includes TiN, TaN, TiAlN, TaAlN, TiSiN, TaSiN or AlN. In some embodiments, the capping layer 153 is TiN that is deposited by ALD process using $TiCl_4$ and $NH_3$ as precursor and is performed at a temperature in a range from about 350° C. to about 450° C., or from about 400° C. to about 450° C. In some examples, the capping layer 153 has a thickness that is in a range from about 5 Å to about 15 Å. The thickness of the capping layer 153 can be adjusted by varying the number of cycles in the ALD process.

Still referring to FIG. 3I, a capping film 154 is conformally formed on the capping layer 153 in the trenches 124 and 134 and in the spaces 126 and 136, in accordance with some embodiments. The capping film 154 also surrounds the semiconductor layers 112. The capping film 154 is in-situ formed by a soaking process performed in the same process chamber as the deposition of the capping layer 153. The capping film 154 includes Al, Mo, Ru, Mn, Zr or Si. In some embodiments, the capping film 154 is Al that is formed by triethyl aluminium (TEAL) soaking on the capping layer 153 at a temperature in a range from about 350° C. to about 425° C. In some examples, the capping film 154 has a thickness in a range from about 5 Å to about 10 Å. The thickness of the capping film 154 can be adjusted by varying the soaking time of the soaking process. In some instances, the soaking time is in a range from about 60 seconds to about 180 seconds. The capping layer 153 and the capping film 154 are together referred to as a second oxygen blocking layer that can prevent the nWF layer 152 from oxidation.

Figure 3J:
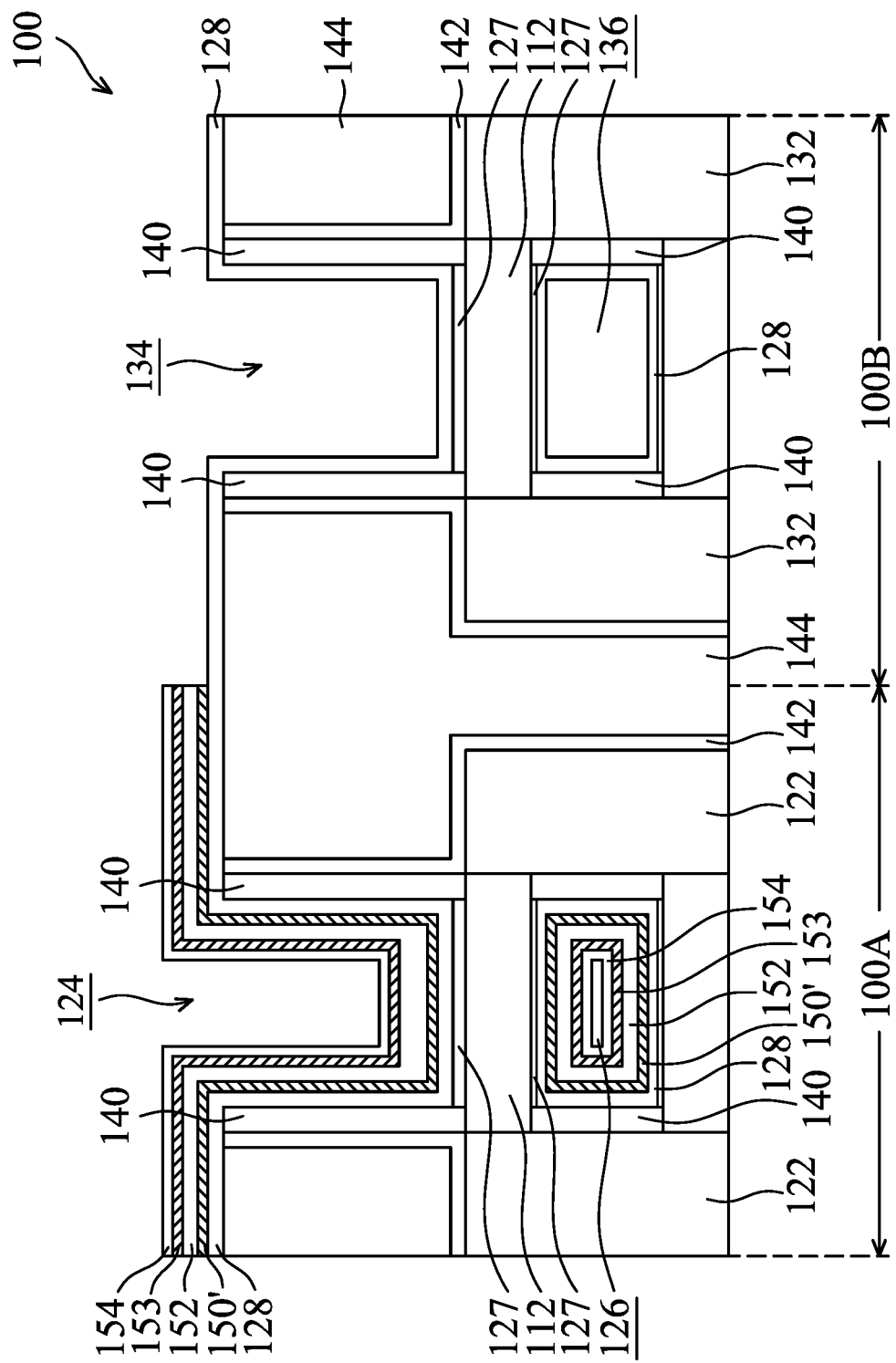

Next, referring to FIG. 3J, the capping film 154, the capping layer 153, the nWF layer 152 and the thin blocking layer 150' in the pMOS region 100B are removed, in accordance with some embodiments. A patterned mask (not shown) such as a patterned photoresist is formed on the capping film 154 in the nMOS region 100A to serve as an etching mask. The capping film 154, the capping layer 153 and the nWF layer 152 in the pMOS region 100B are removed by a dry etching process, a wet etching process or a combination thereof. Next, the thin blocking layer 150' in the pMOS region 100B is removed by a pre-clean process using WCl$_5$ as an etching gas in a process chamber. Thereafter, the gate dielectric layer 128 in the pMOS region 100B is exposed, and then the patterned mask such as the patterned photoresist in the nMOS region 100A is removed in an ashing process.

Figure 3K:
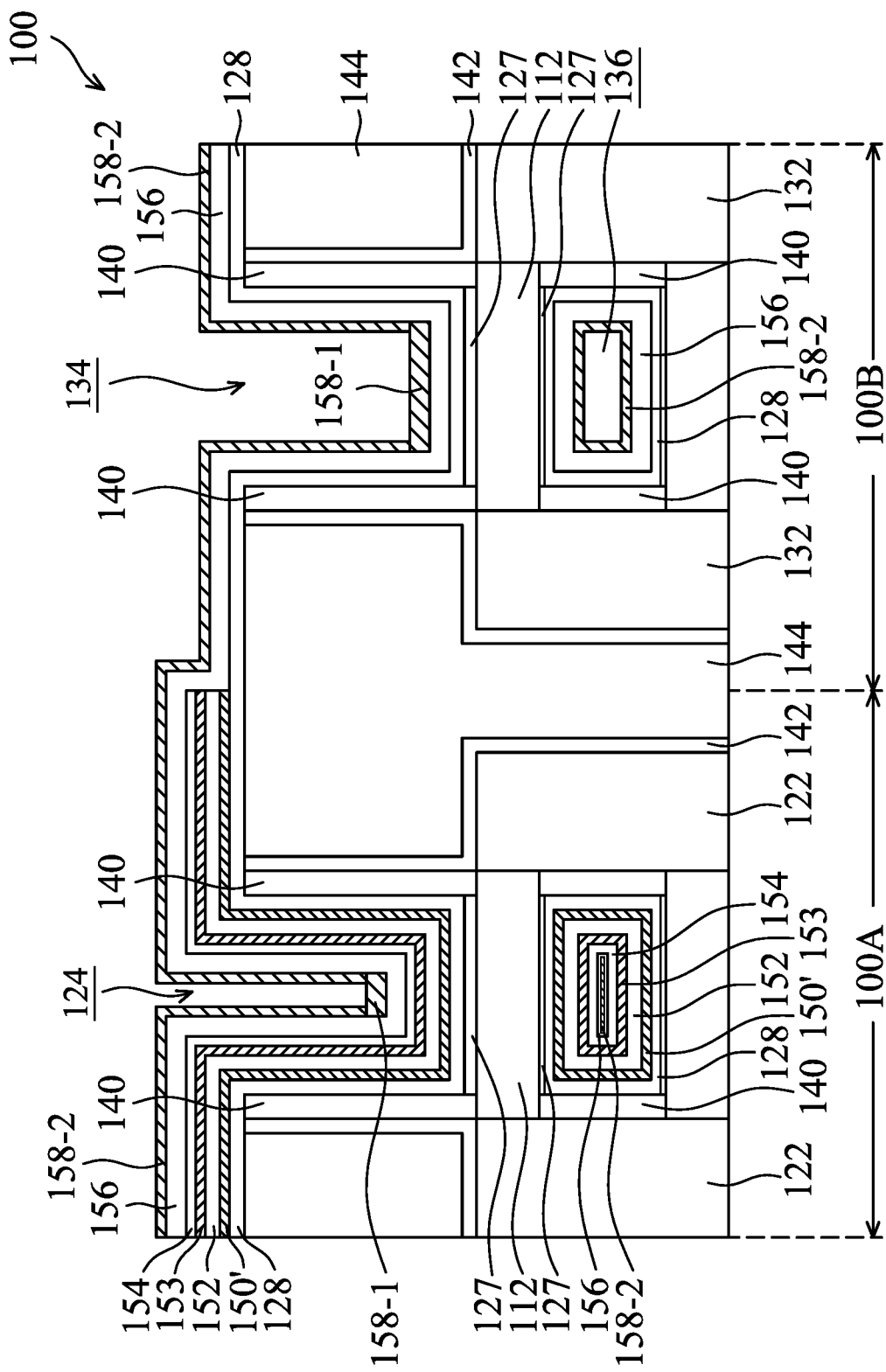

Next, referring to FIG. 3K, a p-type work function (pWF) layer 156 is conformally deposited on the capping film 154 in the trench 124 and the spaces 126, and is also conformally deposited on the gate dielectric layer 128 in the trench 134 and the spaces 136, in accordance with some embodiments. The pWF layer 156 also surrounds the semiconductor layers 112. The pWF layer 156 includes TiN, TaN, TiSiN, TaSiN, TaSi$_2$, Ru, RuO$_2$, Mo, MoN, MoSi$_2$, ZrSi$_2$, NiSi$_2$, WN or WCN, and serves the Vt tuning of pMOS. The pWF layer 156 is in-situ deposited by ALD process that is performed in the same process chamber as the pre-clean process of the thin blocking layer 150' of the pMOS region 100B. In some embodiments, the pWF layer 156 is TiN that is deposited by ALD process using TiCl$_4$ and NH$_3$ as precursor and is performed at a temperature in a range from about 350° C. to about 450° C. In some examples, the pWF layer 156 has a thickness that is in a range from about 10 Å to about 30 Å. The pWF layer 156 has thickness uniformity less than 2% and step coverage over 99%. In some instances, the respective spaces 126 and 136 between the semiconductor layers 112 has the height dl of about 8 nm, and the thickness of the pWF layer 156 is about 15 Å to full fill the spaces 126 and 136. In some instances, the respective spaces 126 and 136 between the semiconductor layers 112 has the height dl of about 10 nm, and there may be some gaps in the spaces 126 and 136 for filling a metal gate fill material.

Still referring to FIG. 3K, a first portion 158-1 of a metal gate fill material is formed on the pWF layer 156 at the bottoms of the trenches 124 and 134, and may also be in the spaces 126 and 136, in accordance with some embodiments. The first portion 158-1 is in-situ deposited by PVD process that is performed in the same process chamber as the deposition of the pWF layer 156. The metal gate fill material includes Co, W, Al, Ru, Cu, another suitable metal material or a combination thereof. In some embodiments, the first portion 158-1 is Co that is deposited using PVD process to fill at the bottoms of the trenches 124 and 134 due to the directional deposition of PVD process.

Afterwards, still referring to FIG. 3K, a second portion 158-2 of the metal gate fill material is conformally deposited on the pWF layer 156 and along the sidewalls of the trenches 124 and 134, and may also be in the spaces 126 and 136 (not shown), in accordance with some embodiments. The second portion 158-2 is in-situ deposited by CVD process that is performed in the same process chamber as the deposition of the first portion 158-1. In some embodiments, the second portion 158-2 is Co that is deposited using CVD process to be along the sidewalls of the trenches 124 and 134. The second portion 158-2 can serve as a seed layer used in a subsequent electrochemical plating (ECP) process to form the metal gate fill material.

Figure 3L:
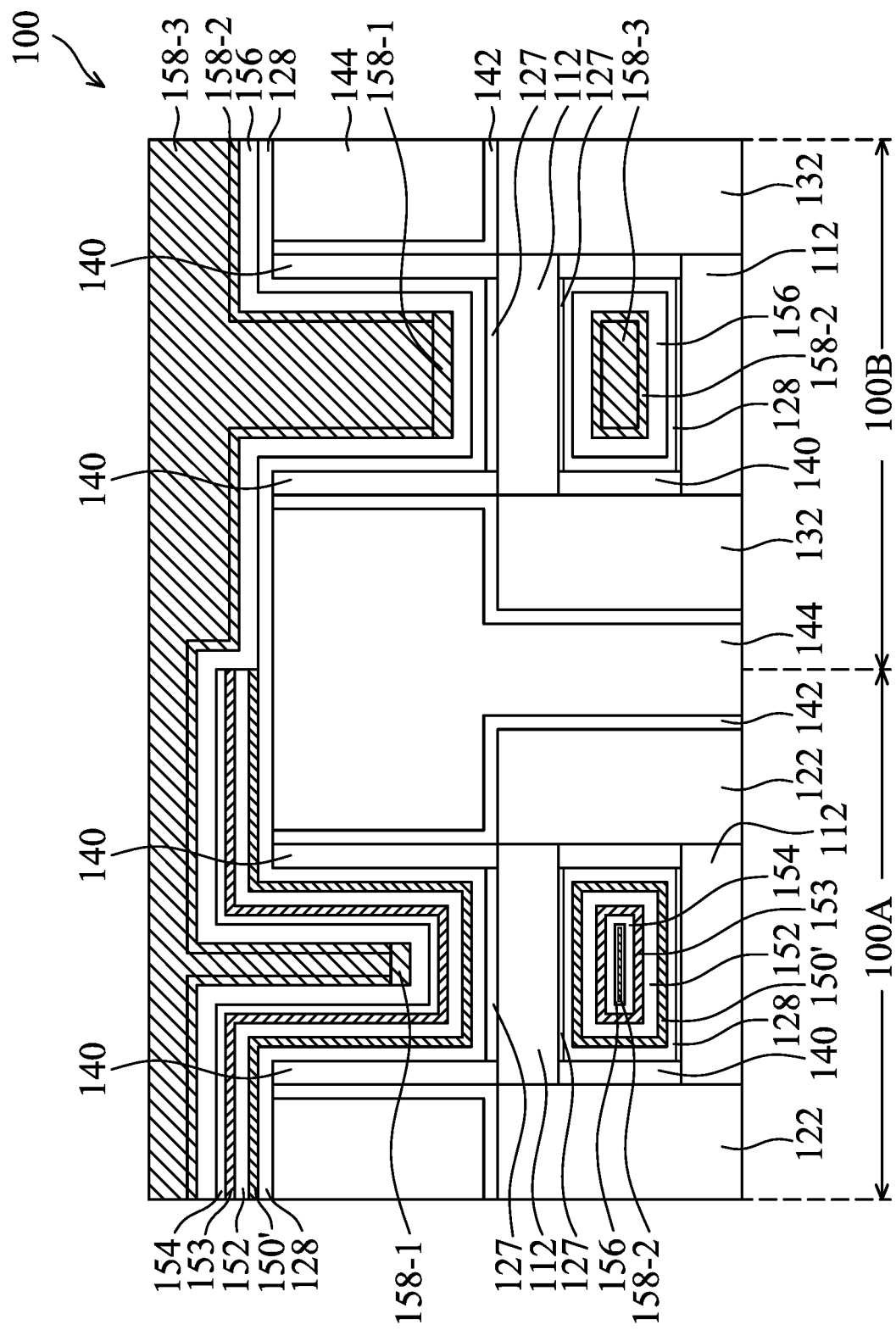

Referring to FIG. 3L, a third portion 158-3 of the metal gate fill material is formed on the second portion 158-2 and the first portion 158-1 to full fill the trenches 124 and 134, and may also be in the spaces 126 and 136 (not shown), in accordance with some embodiments. In some embodiments, the third portion 158-3 is Co that is formed using an ECP process. The ECP process is a bottom-up approach which has good fill capability to full fill the trenches 124 and 134 with the metal gate fill material. The first portion 158-1, the second portion 158-2 and third portion 158-3 are together referred to as the metal gate fill material 158.

Afterwards, still referring to FIG. 3L, an anneal process is performed on the metal gate fill material 158 in the nMOS region 100A and the pMOS region 100B, in accordance with some embodiments. In some embodiments, the anneal process is performed using H$_2$ at a high temperature in a range from about 300° C. to about 600° C. The anneal process can densify the metal gate fill material 158 to enhance the conductivity thereof. According the embodiments of the disclosure, the metal gate fill material 158 can be formed with void free.

Figure 3M:
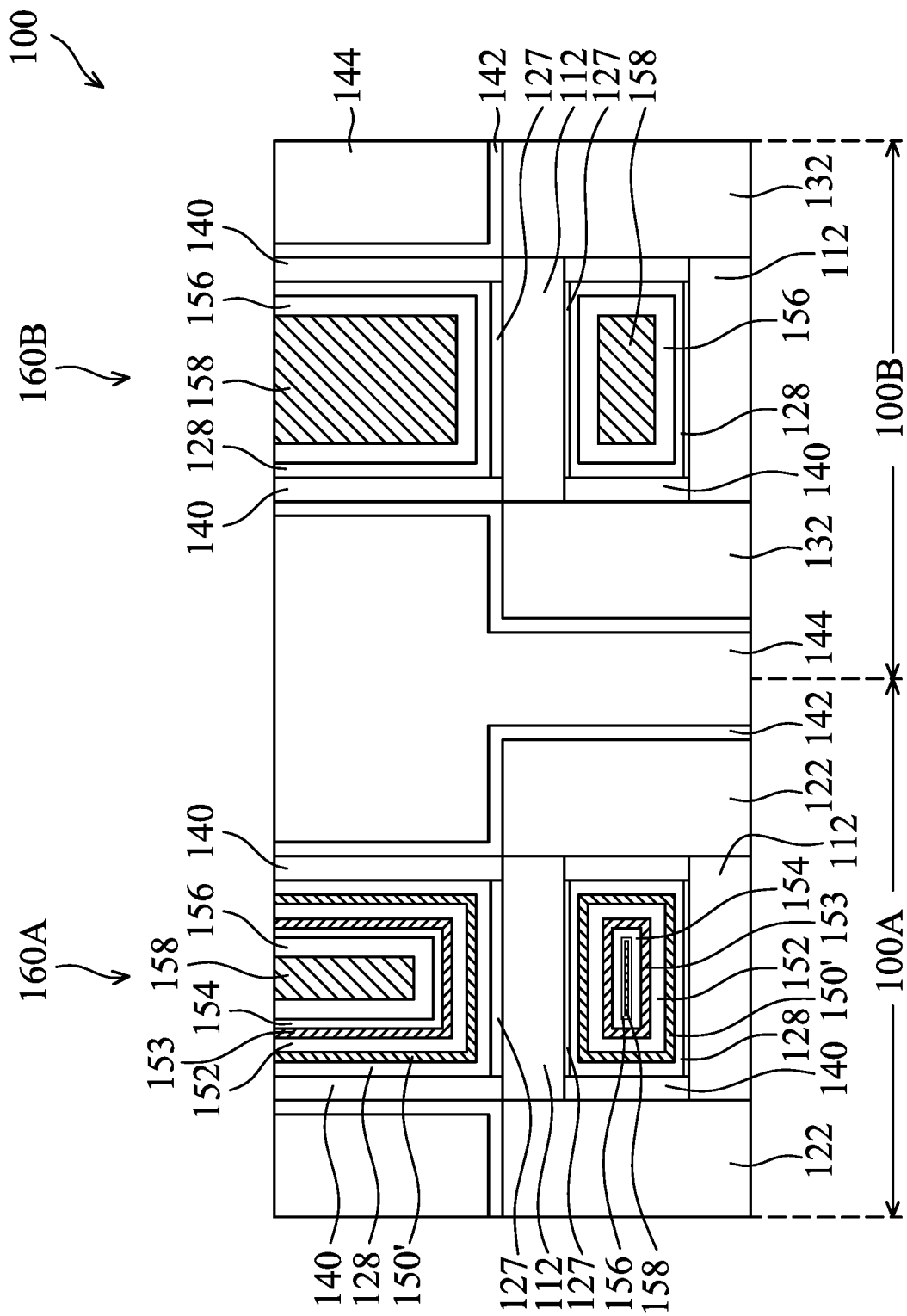

Next, excess portions of the gate dielectric layer 128 and the above mentioned various layers for a gate electrode layer deposited on the top surfaces of the ILD layer 144, the CESL 142 and the gate spacers 140 as shown in FIG. 3L are removed in a planarization process, such as a CMP process. Thereafter, a GAA structure 160A is formed in the nMOS region 100A, and another GAA structure 160B is formed in the pMOS region 100B, as shown in FIG. 3M in accordance with some embodiments. The top surface of the GAA structures 160A and 160B may be coplanar with the top surfaces of the ILD layer 144, the CESL 142 and the gate spacers 140. The GAA structures 160A and 160B are formed in a gate-last process with replacement gate structures to surround the semiconductor layers 112 that serve as channel regions of the semiconductor device 100.

Figure 4:
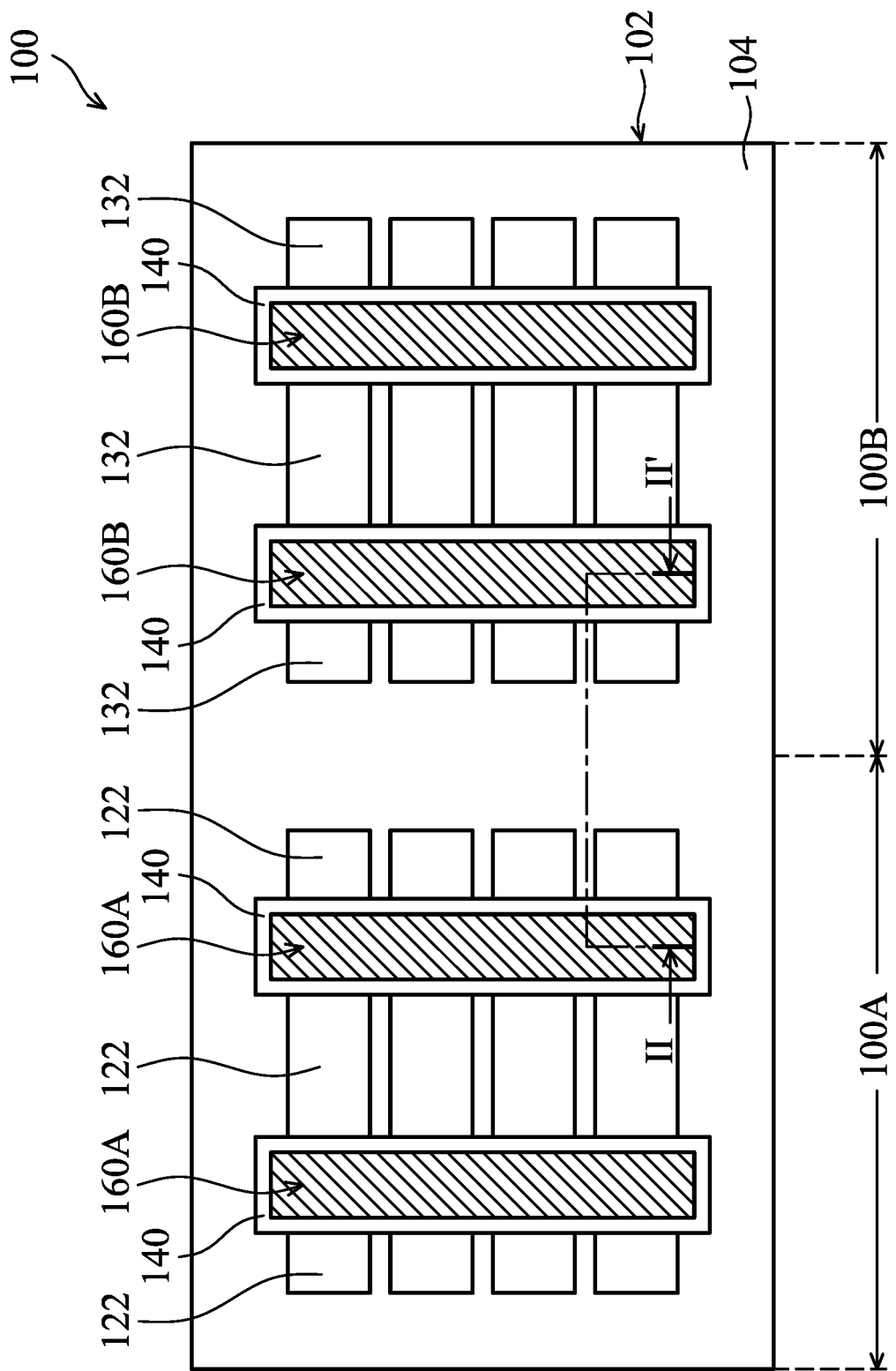
FIG. 4 shows a plane view of a semiconductor device in accordance with some embodiments.

FIG. 4 shows a plane view of a semiconductor device 100 in accordance with some embodiments. The semiconductor device 100 includes multiple GAA structures 160A in the nMOS region 100A, and multiple GAA structures 160B in the pMOS region 100B. Each of the GAA structures 160A and 160B is independently surrounded by the gate spacers 140. Moreover, the GAA structures 160A and 160B surround the channel regions of respective FinFETs. The source and drain structures 122 are disposed on opposite sides of the GAA structure 160A. Also, the source and drain structures 132 are disposed on opposite sides of the GAA structure 160B. In some embodiments, the neighboring epitaxial source or drain structures 122 of different FinFETs in the nMOS region 100A may be merged together. Also, the neighboring epitaxial source or drain structures 132 of different FinFETs in the pMOS region 100B may be merged together. In some other embodiments, the neighboring epitaxial source or drain structures 122 of different FinFETs in the nMOS region 100A may be separated from each other. Also, the neighboring epitaxial source or drain structures 132 of different FinFETs in the pMOS region 100B may be separated from each other. Multiple FinFETs of the nMOS region 100A are isolated from multiple FinFETs of the pMOS region 100B by the isolation structures 104 on the substrate 102. In FIG. 4, for ease of depicting the figure, some components or features (for example, the CESL 142 and the ILD layer 144) illustrated in the above mentioned figures are omitted to avoid obscuring other components or features.

Figure 5:
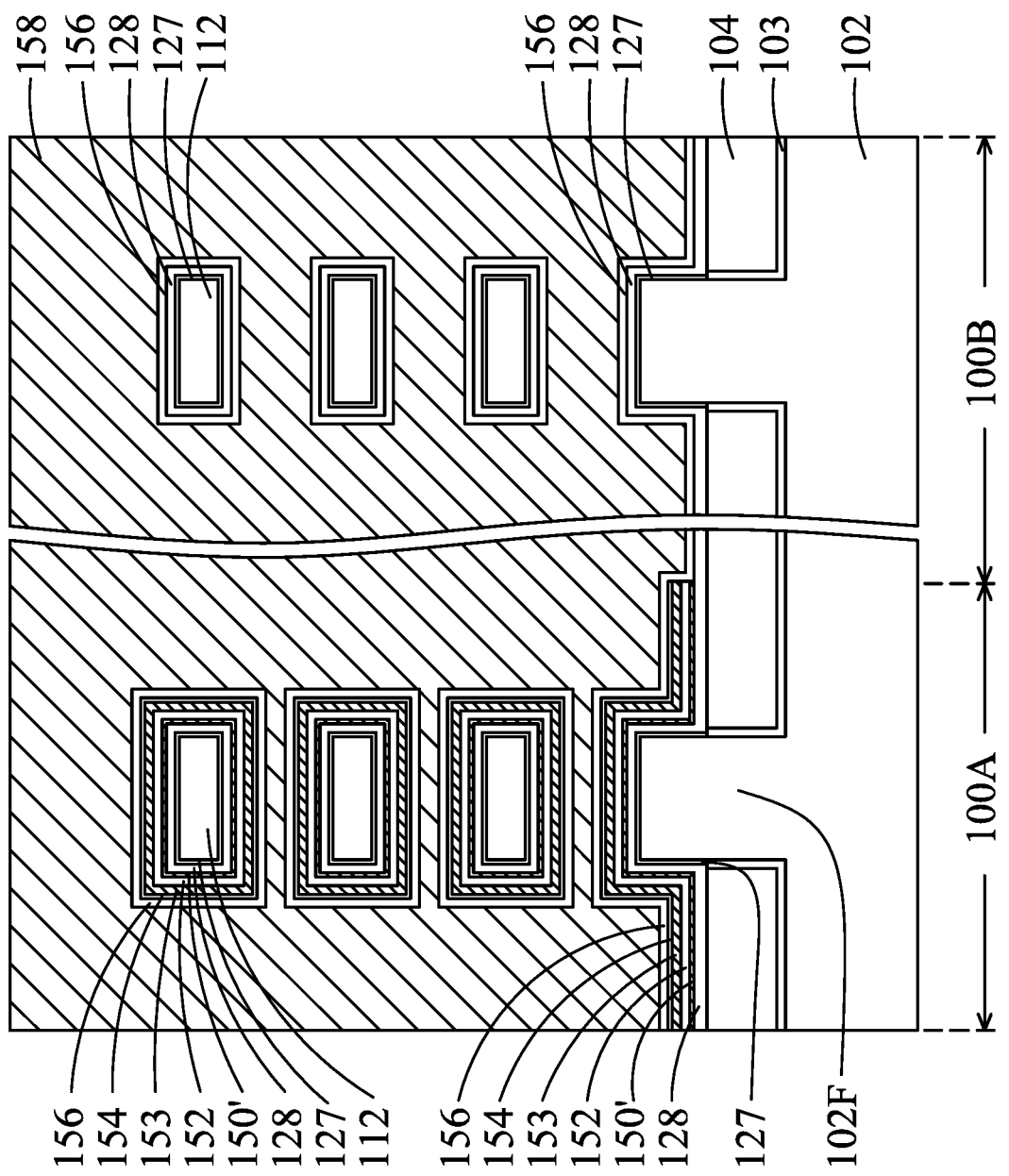
FIG. 5 shows a cross-sectional view of a portion of a semiconductor device taken along line II-II' in FIG. 4, in accordance with some embodiments.

FIG. 5 shows a cross-sectional view of a portion of the semiconductor device 100 taken along line II-II' in FIG. 4, in accordance with some embodiments. Line II-II' is on a plane that is along the GAA structure 160A in the nMOS region 100A and the GAA structure 160B in the pMOS region 100B. In fact, the GAA structure 160A is separated from the GAA structure 160B by the isolation structure 104 which is illustrated with a demarcation line in FIG. 5. The interfacial layer (IL) 127 is conformally formed on the fins 102F and to surround the semiconductor layers (also referred to as nanosheets) 112 in the nMOS region 100A and the pMOS region 100B. The gate dielectric layer 128 is conformally formed on the IL 127 and the isolation structure 104, and to surround the semiconductor layers 112 in the nMOS region 100A and the pMOS region 100B.

In the nMOS region 100A, the GAA structure 160A includes the nWF layer 152 sandwiched between the thin blocking layer 150' and the capping layer 153. The nWF layer 152 is directly deposited on the thin blocking layer 150' after the native oxide is removed from the thin blocking layer 150'. The capping film 154 is formed on the capping layer 153. Each of the thin blocking layer 150', the nWF layer 152, the capping layer 153 and the capping film 154 surround the semiconductor layers 112 in the nMOS region 100A. According to some embodiments of the disclosure, the nWF layer 152 is thin enough for filling in the spaces 126 between the semiconductor layers 112 at the technology nodes of N3 and below. The thin blocking layer 150' can serve as a first oxygen blocking layer to prevent the thin nWF layer 152 from oxidation. In addition, the capping layer 153 and the capping film 154 can together serve as a second oxygen blocking layer to prevent the thin nWF layer 152 from oxidation more efficiently.

The oxidation of the nWF layer will cause the work function of n-type metal gate shift to p-type work function which induces higher threshold voltage (Vt) of nMOS. According to the embodiments of the disclosure, the native oxide removal of the thin blocking layer 150', and the formations of the nWF layer 152, the capping layer 153 and the capping film 154 are in-situ performed in the same process chamber to avoid oxidation of the thin nWF layer 152 more efficiently. Therefore, the semiconductor device 100 can achieve ultra-low Vt of nMOS with ultra-thin nWF layer in GAA structure.

In addition, the pWF layer 156 is conformally formed on and in direct contact with the gate dielectric layer 128 in the pMOS region 100B. In the GAA structure 160B, the pWF layer 156 is directly deposited on the gate dielectric layer 128 without the thin blocking layer 150' in the pMOS region 100B. The pWF layer 156 is also conformally formed on the capping film 154 in the nMOS region 100A. The pWF layer 156 surrounds the semiconductor layers 112 in the nMOS region 100A and the pMOS region 100B. The metal gate fill material 158 is formed in the nMOS region 100A and the pMOS region 100B to surround the semiconductor layers 112, and is also formed on the fins 102F and the isolation structures 104. The top surface of the metal gate fill material 158 of the GAA structure 160A is at the same level with the metal gate fill material 158 of the GAA structure 160B.

Afterwards, via contacts (not shown) to the source and drain structures 122 and the source and drain structures 132 are formed in the ILD layer 144. The via contacts are formed to pass through the CESL layer 142 and to be in contact with the respective source and drain structures 122 and the respective source and drain structures 132. The via contacts are formed by forming contact holes in the ILD layer 144 and the CESL layer 142 using photolithography and etching processes. The source and drain structures 122 and the source and drain structures 132 are exposed through the contact holes.

Thereafter, the contact holes are filled with a conductive material using a deposition process. Moreover, in each of the contact holes, a liner may be conformally deposited on the sidewalls and the bottom surface of the contact hole before filling the contact hole with the conductive material. The liner may be used as a diffusion barrier layer, an adhesion layer, or a combination thereof. The material of the liner may include Ti, TiN, Ta, TaN, or the like. The liner may be deposited by ALD, PECVD, MBD, PVD, or another deposition technique. In addition, an anneal process may be performed to facilitate a reaction between some portions of the liner and the source and drain structures 122 and the source and drain structures 132 to form silicide regions at the respective source and drain structures 122 and the respective source and drain structures 132.

The conductive material of the via contacts includes a metal, such as Co, W, Cu, Al, Au, Ag, alloys thereof, or a combination thereof, and may be deposited by CVD, ALD, PVD, or another deposition technique. Next, excess portion of the conductive material over the ILD layer 144 is removed in a planarization process, such as a CMP process, to form the via contacts.

Afterwards, an additional ILD layer (not shown) is formed on the ILD layer 144 and the GAA structures 160A and 160B. Contacts to the GAA structures 160A and 160B are formed in and pass through the additional ILD layer. The materials and the processes for forming the contacts to the GAA structures 160A and 160B may be the same as or similar to those described above with respect to the via contacts to the source and drain structures 122 and the source and drain structures 132.

According to the embodiments of the disclosure, methods for fabricating the semiconductor devices 100 such as Fin-FET devices with the GAA structures 160A and 160B are provided. The GAA structure 160A in the nMOS region 100A includes the gate dielectric layer 128, the thin blocking layer 150', the n-type work function layer 152, the capping layer 153, the capping film 154 and the p-type work function layer 156 to surround the semiconductor layers (also referred to as nanosheets) 112 in sequence. The GAA structure 160B in the pMOS region 100B includes the gate dielectric layer 128 and the p-type work function layer 156 to surround the semiconductor layers (also referred to as nanosheets) 112 in sequence. The GAA structures 160A and 160B further include the metal gate fill material 158 to full fill the trenches 124 and 134 between the gate spacers 140. The metal gate fill material 158 may also be in the spaces 126 and 136 between the semiconductor layers 112.

In some embodiments of the disclosure, the n-type work function layer 152 is thin enough for easy filling in the spaces 126 between the semiconductor layers 112 at the technology nodes of N3 and below. In some embodiments, each of the spaces 126 between the semiconductor layers 112 has the height dl that is in a range from about 8 nm to about 10 nm. The thickness of the n-type work function layer 152 is in a range from about 10 Å to about 20 Å. A thin n-type work function layer may be easy oxidized to cause the work function of n-type metal gate shift to p-type work function which induces higher threshold voltage (Vt) of nMOS. According to the embodiments of the disclosure, the thin blocking layer 150' can serve as a first oxygen blocking layer to prevent the thin n-type work function layer 152 from oxidation. Moreover, the capping layer 153 and the capping film 154 can together serve as a second oxygen blocking layer to prevent the thin n-type work function layer 152 from oxidation more efficiently.

In addition, according to the embodiments of the disclosure, the native oxide removal of the thin blocking layer 150', and the formations of the n-type work function layer 152, the capping layer 153 and the capping film 154 are in-situ performed in the same process chamber to avoid the oxidation of the thin n-type work function layer 152 more efficiently. Therefore, the semiconductor device 100 can achieve ultra-low threshold voltage (Vt) of nMOS with ultra-thin n-type work function layer for GAA structure.

According to the benefits mentioned above, the embodiments of the disclosure are suitable for semiconductor devices with GAA structure at multiple technology nodes of 20 nm (N20), N16, N10, N7, N5, N3 and beyond. The GAA structures of the semiconductor devices use ultra-thin n-type work function layer and thin oxygen blocking layers to fill the spaces between nanosheets and the trenches between the gate spacers. Therefore, the process window of filling metal gates can be enlarged. Moreover, the thin oxygen blocking layers can reduce gate resistance for device performance improvement.

Furthermore, according to the embodiments of the disclosure, the four steps in-situ processes of forming the ultra-thin n-type work function layer sandwiched between the oxygen blocking layers can efficiently prevent oxidation of the ultra-thin n-type work function layer. Therefore, ultra-low Vt tuning of nMOS for the semiconductor devices beyond N3 technology node with ultra-thin n-type work function layer in the GAA structure can be achieved to gain device performance.

In some embodiments, a method of fabricating a semiconductor device is provided. The method includes forming a fin structure on a substrate. The fin structure comprises a stack of alternating first semiconductor layers and second semiconductor layers. The method also includes removing the first semiconductor layers to form spaces between the second semiconductor layers, and depositing a gate dielectric layer to surround the second semiconductor layers. The method further includes depositing a first oxygen blocking layer on the gate dielectric layer to surround the second semiconductor layers, and removing the native oxide from the first oxygen blocking layer in a process chamber. In addition, the method includes depositing an n-type work function layer on the first oxygen blocking layer to surround the second semiconductor layers in the process chamber. The method also includes forming a second oxygen blocking layer on the n-type work function layer to surround the second semiconductor layers in the process chamber. The second oxygen blocking layer includes a capping layer and a capping film on the capping layer. The method further includes forming a metal gate fill material on the capping film to form a gate-all-around structure.

In some embodiments, a method of fabricating a semiconductor device is provided. The method includes forming a plurality of semiconductor nanosheets over a substrate in a p-type device region and an n-type device region. The semiconductor nanosheets are separated from each other. The method also includes depositing a gate dielectric layer to surround the semiconductor nanosheets in both the p-type device region and the n-type device region. The method further includes depositing a first oxygen blocking layer on the gate dielectric layer to surround the semiconductor nanosheets in the n-type device region, and removing the native oxide from the first oxygen blocking layer in a process chamber. In addition, the method includes depositing an n-type work function layer on the first oxygen blocking layer to surround the semiconductor nanosheets in the process chamber. The method also includes forming a second oxygen blocking layer on the n-type work function layer to surround the semiconductor nanosheets in the process chamber. The second oxygen blocking layer includes a capping layer and a capping film on the capping layer. The method further includes depositing a p-type work function layer directly on the gate dielectric layer to surround the semiconductor nanosheets in the p-type device region and on the second oxygen blocking layer in the n-type device region in the process chamber. In addition, the method includes depositing a metal gate fill material on the p-type work function layer to form a first gate-all-around structure in the n-type device region and to form a second gate-all-around structure in the p-type device region.

In some embodiments, a semiconductor device is provided. The semiconductor device includes a fin protruding from a semiconductor substrate, and a plurality of semiconductor nanosheets separated from each other and disposed over the fin. The semiconductor device also includes a first gate-all-around (GAA) structure surrounding the semiconductor nanosheets in an n-type device region. The first GAA structure includes an n-type work function layer sandwiched between a first oxygen blocking layer and a second oxygen blocking layer. The semiconductor device further includes a second GAA structure surrounding the semiconductor nanosheets in a p-type device region. The second GAA structure includes a p-type work function layer directly on a gate dielectric layer. In addition, the semiconductor device includes first source and drain structures disposed on opposite sides of the first GAA structure. The semiconductor device also includes second source and drain structures disposed on opposite sides of the second GAA structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a fin structure on a substrate, wherein the fin structure comprises a stack of alternating first semiconductor layers and second semiconductor layers;
    removing the first semiconductor layers to form spaces between the second semiconductor layers;
    depositing a gate dielectric layer to surround the second semiconductor layers;
    depositing a first oxygen blocking layer on the gate dielectric layer to surround the second semiconductor layers;
    removing a native oxide from the first oxygen blocking layer in a process chamber;
    depositing an n-type work function layer on the first oxygen blocking layer to surround the second semiconductor layers in the process chamber;
    forming a second oxygen blocking layer on the n-type work function layer to surround the second semiconductor layers in the process chamber, wherein the second oxygen blocking layer comprises a capping layer and a capping film on the capping layer; and
    forming a metal gate fill material on the capping film to form a gate-all-around structure.

2. The method as claimed in claim 1, wherein the first oxygen blocking layer comprises tantalum nitride (TaN), and the native oxide of TaN is removed by a dry etching process using an etching gas that comprises $TaCl_5$ or $WCl_5$.

3. The method as claimed in claim 1, wherein the capping layer includes titanium comprises (TiN), and the capping layer is deposited using an atomic layer deposition (ALD) process.

4. The method as claimed in claim 1, wherein the capping film comprises aluminum (Al) and is formed by soaking in triethylaluminum (TEAl).

5. The method as claimed in claim 1, wherein the metal gate fill material comprises cobalt (Co), and the metal gate fill material is formed using a physical vapor deposition (PVD) process, a chemical vapor deposition (CVD) process, and an electrochemical plating (ECP) process in sequence.

6. The method as claimed in claim 1, wherein each of the spaces between the second semiconductor layers has a height that is in a range from about 8 nm to about 10 nm, and the n-type work function layer has a thickness that is in a range from about 10 Å to about 20 Å.

7. The method as claimed in claim 1, further comprising:
forming a dummy gate structure on the fin structure;
forming gate spacers on sidewalls of the dummy gate structure;
etching the fin structure to form recesses;
forming source and drain structures in the recesses;
depositing an interlayer dielectric layer on the source and drain structures; and
removing the dummy gate structure to form a trench in the interlayer dielectric layer and between the gate spacers, wherein the trench is filled with the gate-all-around structure.

8. A method of fabricating a semiconductor device, comprising:
forming a plurality of semiconductor nanosheets over a substrate in a p-type device region and an n-type device region, wherein the semiconductor nanosheets are separated from each other;
depositing a gate dielectric layer to surround the semiconductor nanosheets in both the p-type device region and the n-type device region;
depositing a first oxygen blocking layer on the gate dielectric layer to surround the semiconductor nanosheets in the n-type device region;
removing a native oxide from the first oxygen blocking layer in a process chamber;
depositing an n-type work function layer on the first oxygen blocking layer to surround the semiconductor nanosheets in the process chamber;
forming a second oxygen blocking layer on the n-type work function layer to surround the semiconductor nanosheets in the process chamber, wherein the second oxygen blocking layer comprises a capping layer and a capping film on the capping layer;
depositing a p-type work function layer directly on the gate dielectric layer to surround the semiconductor nanosheets in the p-type device region and on the second oxygen blocking layer in the n-type device region in the process chamber; and
depositing a metal gate fill material on the p-type work function layer to form a first gate-all-around structure in the n-type device region and to form a second gate-all-around structure in the p-type device region.

9. The method as claimed in claim 8, wherein the first oxygen blocking layer comprises tantalum nitride (TaN), and the native oxide of TaN is removed by a dry etching process using an etching gas that comprises $TaCl_5$ or $WCl_5$.

10. The method as claimed in claim 8, wherein the capping layer comprises titanium nitride (TiN) and is deposited using an atomic layer deposition (ALD) process, and the capping layer has a thickness that is in a range from about 5 Å to about 15 Å.

11. The method as claimed in claim 10, wherein the capping film comprises aluminum (Al) and is formed by soaking in triethylaluminum (TEAl), and the capping film has a thickness that is in a range from about 5 Å to about 10 Å.

12. The method as claimed in claim 8, wherein the metal gate fill material comprises cobalt (Co) and is deposited using a physical vapor deposition (PVD) process, a chemical vapor deposition (CVD) process and an electrochemical plating (ECP) process in sequence.

13. The method as claimed in claim 8, wherein the n-type work function layer comprises titanium aluminum carbide (TiAlC) and is deposited using an ALD process, the semiconductor nanosheets are separated from each other by a distance that is in a range from about 8 nm to about 10 nm, and the n-type work function layer has a thickness that is in a range from about 10 Å to about 20 Å.

14. The method as claimed in claim 8, wherein the p-type work function layer comprises titanium nitride (TiN) and is deposited using an ALD process.

15. A method of fabricating a semiconductor device, comprising:
forming a fin structure on a substrate, wherein the fin structure comprises a stack of alternating first semiconductor layers and second semiconductor layers;
removing the first semiconductor layers;
forming a gate dielectric layer wrapping around the second semiconductor layers;
forming a first capping layer over the gate dielectric layer wrapping around the second semiconductor layers;
annealing the first capping layer;
removing the first capping layer;
depositing a first blocking layer over the gate dielectric layer wrapping around the second semiconductor layers;
forming a work function layer on the first blocking layer wrapping around the second semiconductor layers;
forming a second blocking layer on the work function layer wrapping around the second semiconductor layers; and
forming a metal gate fill material on the second blocking layer to form a gate-all-around structure.

16. The method as claimed in claim 15, wherein the first capping layer is TiSiN, and the first capping layer is deposited by an atomic layer deposition (ALD) process using $TiCl_4$, $SiH_4$ and $NH_3$ as precursor.

17. The method as claimed in claim 15, further comprising:
depositing a second capping layer on the first capping layer wrapping around the second semiconductor layers;
annealing the second capping layer; and
removing the second capping layer.

18. The method as claimed in claim 17, wherein the second capping layer is Si, and the second capping layer is deposited by a chemical vapor deposition (CVD) process using $Si_2H_6$ and $H_2$ as precursor.

19. The method as claimed in claim 17, further comprising:
annealing the gate dielectric layer after removing the first capping layer and the second capping layer.

20. The method as claimed in claim 15, wherein the first blocking layer comprises a metal nitride layer, and the second blocking layer comprises a metal nitride layer and a metal film on the metal nitride layer.

\* \* \* \* \*